United States Patent
Balakrishnan et al.

(10) Patent No.: US 9,991,359 B1
(45) Date of Patent: Jun. 5, 2018

(54) VERTICAL TRANSISTOR GATED DIODE

(71) Applicant: International Business Machines Corporation, Armonk, NY (US)

(72) Inventors: Karthik Balakrishnan, White Plains, NY (US); Alexander Reznicek, Troy, NY (US)

(73) Assignee: International Business Machines Corporation, Armonk, NY (US)

(*) Notice: Subject to any disclaimer, the term of this patent is extended or adjusted under 35 U.S.C. 154(b) by 0 days. days.

(21) Appl. No.: 15/623,774

(22) Filed: Jun. 15, 2017

(51) Int. Cl.
*H01L 29/66* (2006.01)
*H01L 29/739* (2006.01)
*H01L 29/423* (2006.01)

(52) U.S. Cl.
CPC .... *H01L 29/66356* (2013.01); *H01L 29/7391* (2013.01); *H01L 29/42392* (2013.01); *H01L 29/66545* (2013.01); *H01L 29/66666* (2013.01)

(58) Field of Classification Search
None
See application file for complete search history.

(56) References Cited

U.S. PATENT DOCUMENTS

| | | | |
|---|---|---|---|
| 6,580,124 B1 | 6/2003 | Cleeves et al. | |
| 6,903,411 B1* | 6/2005 | Chyan | H01L 21/76895 257/327 |
| 7,888,775 B2 | 2/2011 | Russ et al. | |
| 8,624,323 B2 | 1/2014 | Gates et al. | |
| 8,901,655 B2 | 12/2014 | Chang et al. | |
| 8,928,083 B2 | 1/2015 | Chang et al. | |
| 9,006,054 B2 | 4/2015 | Cheng et al. | |
| 9,299,835 B1 | 3/2016 | Anderson et al. | |
| 9,431,305 B1 | 8/2016 | Anderson et al. | |
| 2003/0052721 A1* | 3/2003 | Chaudhry | H01L 21/82285 327/242 |
| 2014/0191319 A1 | 7/2014 | Cheng et al. | |
| 2015/0069475 A1* | 3/2015 | Colinge | B82Y 10/00 257/288 |
| 2016/0268375 A1* | 9/2016 | Chen | H01L 29/0673 |

OTHER PUBLICATIONS

Moroz, V. et al., "Modeling and Optimization of Group IV and III-V FinFETs and Nano-Wires", IEEE International Electron Devices Meeting (IEDM), Dec. 2014, pp. 7.4.1-7.4.4.

* cited by examiner

*Primary Examiner* — Tom Thomas
*Assistant Examiner* — Nilufa Rahim
(74) *Attorney, Agent, or Firm* — Scully, Scott, Murphy & Presser, P.C.; Daniel P. Morris, Esq.

(57) ABSTRACT

After forming a trench extending through a sacrificial gate layer to expose a surface of a doped bottom semiconductor layer, a diode including a first doped semiconductor segment and a second doped semiconductor segment having a different conductivity type than the first doped semiconductor segment is formed within the trench. The sacrificial gate layer that laterally surrounds the first doped semiconductor segment and the second doped semiconductor segment is subsequently replaced with a gate structure to form a gated diode.

8 Claims, 21 Drawing Sheets

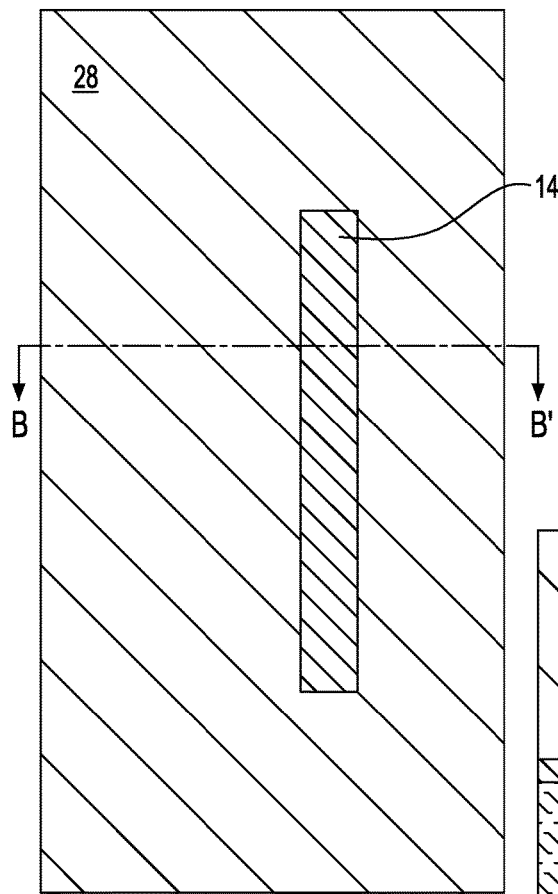
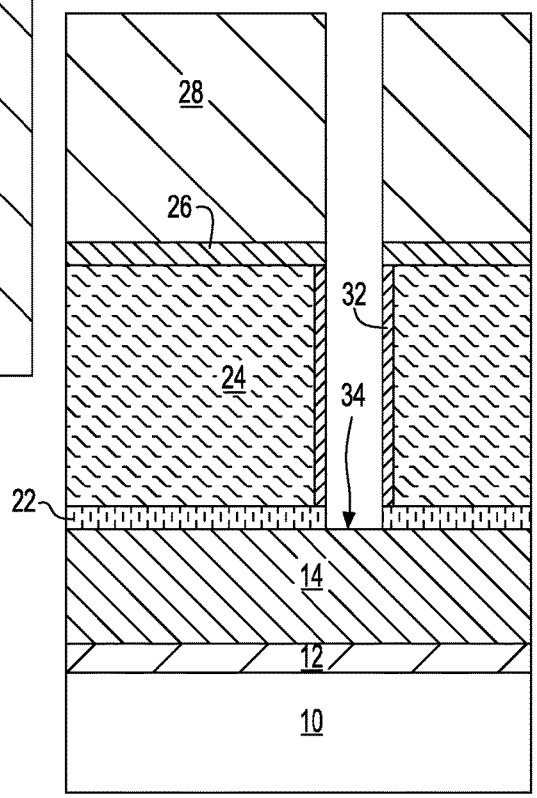
FIG. 4A
FIG. 4B

VERTICAL TRANSISTOR GATED DIODE

BACKGROUND

The present application relates to semiconductor device fabrication, and more specifically to the fabrication of vertical gated diodes using a gate-last process flow.

Vertical field effect transistors (FETs) are attractive candidates for 5 nm node and beyond technologies due to better density scaling and better control of electrostatics. Gated diodes are often used in conjunction with FETs in complementary metal oxide semiconductor (CMOS) integrated circuits for important analog circuit functions including temperature sensing and bandgap reference voltage applications. Vertical FETs are commonly formed by a gate-last process flow. A method for fabrication of gated diodes that is compatible with the gate-last process flow is thus desirable for integration of vertical FETs and gated diodes.

SUMMARY

The present application provides a method for fabricating vertical gated diodes that is compatible with the gate-last process flow used for formation of vertical FETs.

According to an embodiment, a semiconductor structure is provided. The semiconductor structure includes a first doped semiconductor segment of a first conductivity type extending upwards from a doped bottom semiconductor layer located on a substrate, a second doped semiconductor segment of a second conductivity type opposite from the first conductivity type located on the first doped semiconductor segment, a doped top semiconductor region laterally surrounding a top portion of the doped top semiconductor region, and a gate structure laterally surrounding the first doped semiconductor segment and the second doped semiconductor segment located between the doped bottom semiconductor layer and the doped top semiconductor region.

According to another embodiment, a method of forming a semiconductor structure is provided. The method includes first forming a first doped semiconductor segment of a first conductivity type in a lower portion of a trench that extends through a material stack located on a doped bottom semiconductor layer of the first conductivity type. The material stack includes, from bottom to top, a bottom spacer layer, a sacrificial gate layer, and a dielectric capping layer. A second doped semiconductor segment of a second conductivity type is then formed on the first doped semiconductor segment within the trench. The second conductivity type is opposite from the first conductivity type. Next, after removing the dielectric capping layer to exposing a top portion of the second doped semiconductor segment, a doped top semiconductor region of the second conductivity type is formed laterally surrounding the top portion of the second doped semiconductor segment. Next, a sidewall spacer is formed on sidewalls of the doped top semiconductor region. Subsequently, the sacrificial gate layer is removed followed by forming a gate structure laterally surrounding an upper portion of the first doped semiconductor segment and a lower portion of the second doped semiconductor segment previously covered by the sacrificial gate layer.

BRIEF DESCRIPTION OF THE DRAWINGS

FIG. 4A is a top view of the exemplary semiconductor structure of FIGS. 3A and 3B after removing a portion of the bottom spacer layer that is physically exposed by the trench to expose a surface of the doped bottom semiconductor layer.

FIG. 4B is a cross-sectional view of the exemplary semiconductor structure of FIG. 4A along line B-B'.

DETAILED DESCRIPTION

Figure 1A:
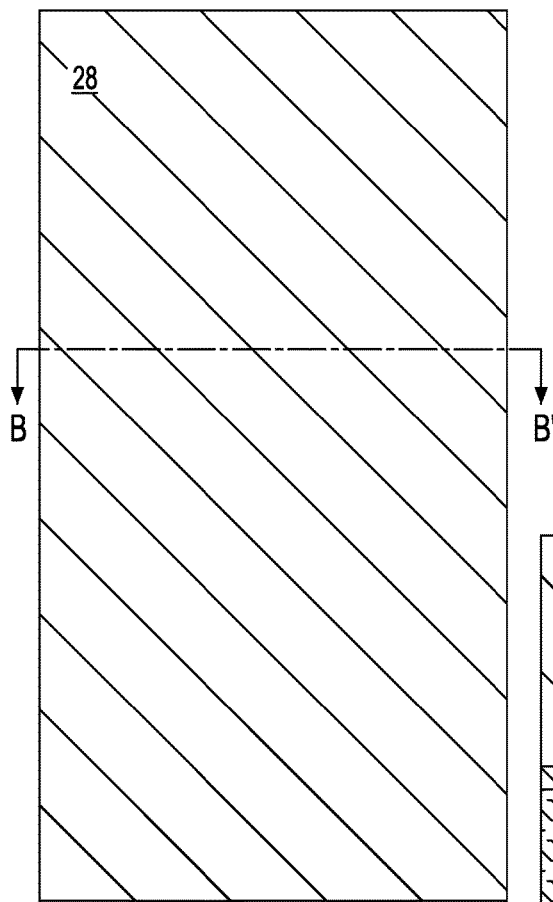
FIG. 1A is top view of an exemplary semiconductor structure according to an embodiment of the present application including a material stack located on a semiconductor substrate, wherein the material stack includes, from bottom to top, a punch through stop (PTS) layer, a doped bottom semiconductor layer, a bottom spacer layer, a sacrificial gate layer, a top spacer layer and a dielectric capping layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1B:
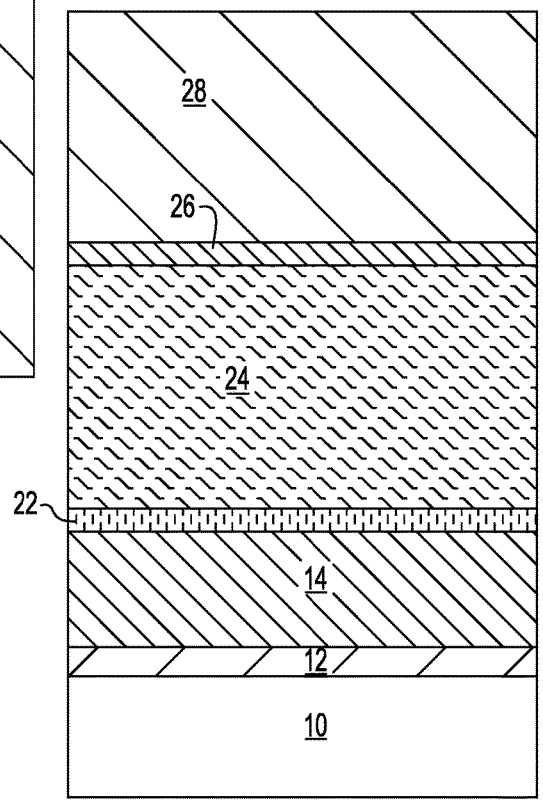
FIG. 1B is a cross-sectional view of the exemplary semiconductor structure of FIG. 1A along line B-B'.

Reference to FIGS. 1A and 1B, there are illustrated various views of an exemplary semiconductor structure containing a material stack formed on a semiconductor substrate 10 that can be employed in accordance with an embodiment of the present application. The material stack includes, from bottom to top, a punch through stop (PTS) layer 12, a doped bottom semiconductor layer 14, a bottom spacer layer 22, a sacrificial gate layer 24, a top spacer layer 26, and a dielectric capping layer 28.

The semiconductor substrate 10 can be a bulk semiconductor substrate including at least one semiconductor material that contiguously extends from the topmost surface of the semiconductor substrate 10 to a bottommost surface of the semiconductor substrate 10 or a top semiconductor material layer of a semiconductor-on-insulator (SOI) substrate. The semiconductor substrate 10 may include any semiconductor material including, for example, Si, Ge, SiGe, SiC, SiGeC, InAs, InP, InAsP, GaAs, and all other III-V or II-VI compound semiconductor materials. In one embodiment of the present application, the semiconductor substrate 10 is composed of silicon. The semiconductor material that provides the semiconductor substrate 10 is typically a single crystalline semiconductor such as, for example, single crystalline silicon.

The PTS layer 12 may include any semiconductor material as mentioned above for the semiconductor substrate 10. In one embodiment of the present application, the PTS layer 12 includes a same semiconductor material as the semiconductor material that provides the semiconductor substrate 10. For example, both the PTS layer 12 and the semiconductor substrate 10 may be composed of silicon. In another embodiment of the present application, the PTS layer 12 includes a different semiconductor material than the semiconductor material that provides the semiconductor substrate 10. For example, the PTS layer 12 may be composed of SiGe and the semiconductor substrate 10 may be composed of silicon.

The PTS layer 12 includes a p-type or an n-type dopant. The term "p-type" refers to the addition of impurities to an intrinsic semiconductor that creates deficiencies of valence electrons. Examples of p-type dopants, i.e., impurities, include, but are not limited to, boron, aluminum, gallium, and indium. "N-type" refers to the addition of impurities that contributes free electrons to an intrinsic semiconductor. Examples of n-type dopants, i.e., impurities, include, but are not limited to, antimony, arsenic, and phosphorous. The PTS layer 12 is heavily doped having a dopant concentration ranging from $1\times10^{21}$ atoms/cm$^3$ to $1\times10^{22}$ atoms/cm$^3$. The thickness of the PTS layer 12 can be from 10 nm to 50 nm, although lesser and greater thicknesses can also be employed.

The PTS layer 12 may be formed within, or on, the semiconductor substrate 10, where the PTS layer 12 is employed to electrically isolate the doped bottom semiconductor layer 14 from the semiconductor substrate 10. In some embodiments, the PTS layer 12 may be formed within the semiconductor substrate 10 by introducing the dopant into an upper portion of the semiconductor substrate 10 using, for example, ion implantation or gas phase doping. In other embodiments, the PTS layer 12 may be formed on top of the semiconductor substrate 10 utilizing an epitaxial growth process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material layer that is formed by an epitaxial deposition process has the same crystalline characteristics as the deposition surface on which it is formed. For example, an epitaxial semiconductor material layer deposited on a {100} crystal surface will take on a {100} orientation. In the present application, the PTS layer 12 has an epitaxial relationship, i.e., same crystal orientation, as that of the underlying semiconductor substrate 10.

Examples of various epitaxial growth processes that are suitable for use in forming the PTS layer 12 include, e.g., chemical vapor deposition (CVD), molecular beam epitaxy (MBE) and metal-organic chemical vapor deposition (MOCVD). The temperature for epitaxial deposition typically ranges from 350° C. to 900° C. Although higher temperature typically results in faster deposition, the faster deposition may result in crystal defects and film cracking.

A number of different source gases may be used for the deposition of the semiconductor material that provides the PTS layer 12. In some embodiments, the source gas for the deposition of the semiconductor material that provides the PTS layer 12 includes a silicon source gas, a germanium source gas or a mixture of a silicon-containing source gas and a germanium-containing source gas. Carrier gases like hydrogen, nitrogen, helium and argon can be used.

In some embodiments, the dopant can be introduced in-situ as the semiconductor material that provides the PTS layer 12 is being deposited, i.e., during the epitaxial growth process. In other embodiments, the dopant can be introduced into the PTS layer 12 after the epitaxial growth process, for example, by ion implantation.

The doped bottom semiconductor layer 14 may include a semiconductor material the same as, or different from, the semiconductor material that provides the PTS layer 12. The doped bottom semiconductor layer 14 is counter-doped with respect to the PTS layer 12 and thus includes a dopant having a conductivity type opposite to that of the dopant in the PTS layer 12. For example, when the PTS layer 12 includes a p-type dopant, the doped bottom semiconductor layer 14 includes an n-type dopant, and when the PTS layer 12 includes an n-type dopant, the doped bottom semiconductor layer 14 includes a p-type dopant. In one embodiment, the PTS layer 12 is composed of p-doped silicon, and the doped bottom semiconductor layer 14 is composed of n-doped silicon. The doped bottom semiconductor layer 14 is heavily doped having a dopant concentration ranging from $1\times10^{21}$ atoms/cm$^3$ to $1\times10^{22}$ atoms/cm$^3$.

The doped bottom semiconductor layer 14 may be formed using an epitaxial growth process described above in formation of the PTS layer 12. For example, the doped bottom semiconductor layer 14 can be formed by CVD or MBE. The doped bottom semiconductor layer 14 thus has a same crystalline orientation as that of the PTS layer 12. The thickness of the doped bottom semiconductor layer 14 can be from 50 nm to 200 nm, although lesser and greater thicknesses can also be employed. The dopant can be provided during the epitaxial growth process by in-situ doping, or after epitaxial growth process by ion implantation or gas phase doping. The doped bottom semiconductor layer 14 serves as an anode or a cathode of a diode (herein referred to as an anode/cathode) to be subsequently formed. It should be noted that an anode and a cathode of a diode may be interchanged depending on the doping of the diode segments.

Each of the bottom spacer layer 22 and the top spacer layer 26 may include a same or different dielectric material such as, for example, silicon nitride or boron nitride. The bottom spacer layer 22 and the top spacer layer 26 may be formed by a deposition process such as, for example, CVD or physical vapor deposition (PVD). The bottom spacer layer 22 and the top spacer layer 26 may each have a thickness from 5 nm to 10 nm, although lesser and greater thicknesses can also be employed.

The sacrificial gate layer 24 may include a semiconductor material such as, for example, amorphous silicon (a-Si) or polycrystalline silicon (polysilicon). The sacrificial gate layer 24 may be formed by a deposition process including, but not limited to, CVD, PVD or plasma enhanced chemical vapor deposition (PECVD). The thickness of the sacrificial gate layer 24 can be from 10 nm to 30 nm, although lesser and greater thicknesses can also be employed.

The dielectric capping layer 28 may include a dielectric oxide such as, for example, silicon dioxide, tetraethylorthosilicate (TEOS) oxide, high aspect ratio plasma (HARP) oxide, high temperature oxide (HTO) or high density plasma (HDP) oxide. The dielectric capping layer 28 may be formed, for example, by CVD or PVD. The thickness of the dielectric capping layer 28 can be from 50 nm to 100 nm, although lesser and greater thicknesses can also be employed.

Figures 2A, 2B:
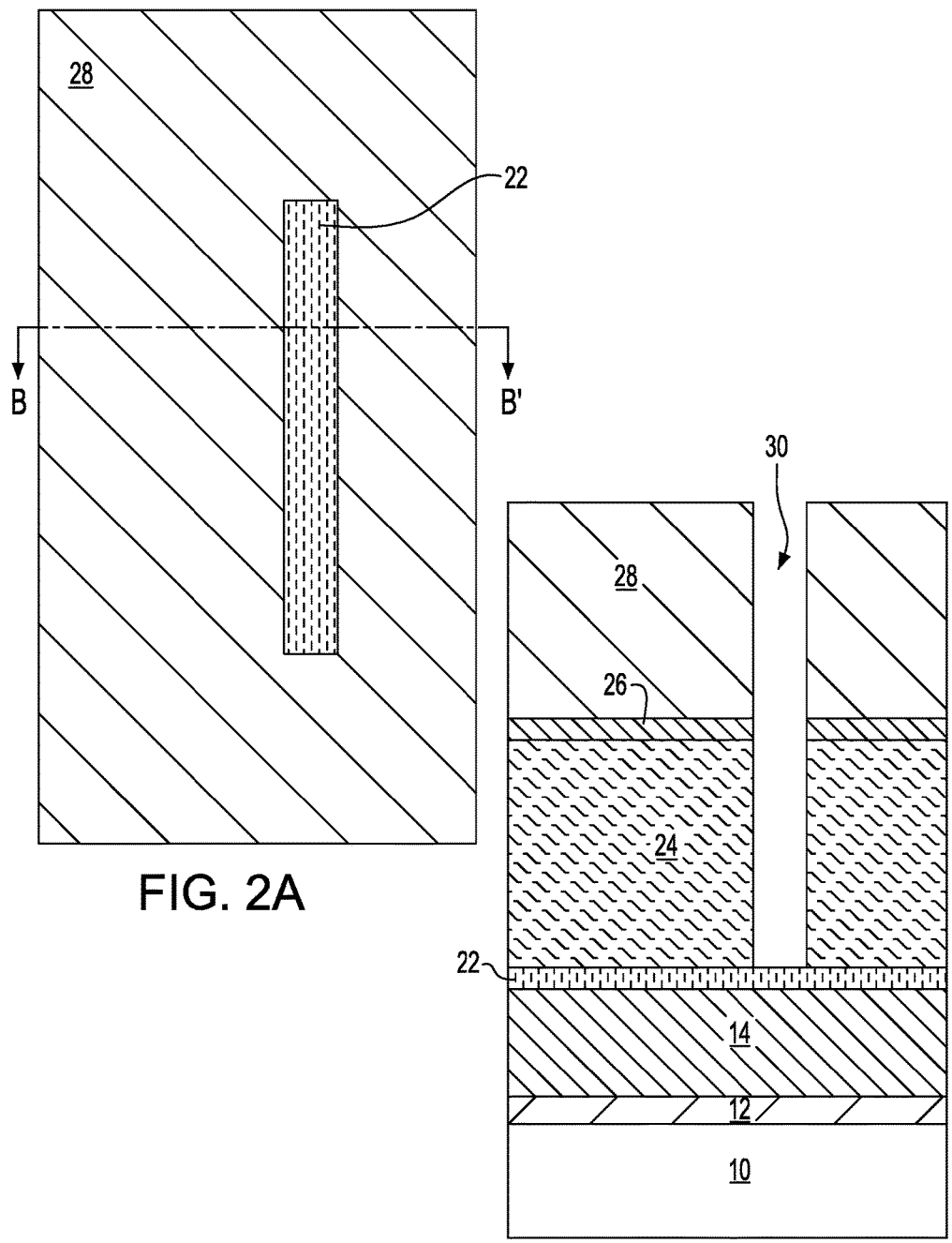
FIG. 2A is a top view of the exemplary semiconductor structure of FIGS. 1A and 1B after forming a trench extending through the dielectric capping layer, the top spacer layer, and the sacrificial gate layer to physically expose a surface of the bottom spacer layer.
FIG. 2B is a cross-sectional view of the exemplary semiconductor structure of FIG. 2A along line B-B'.
Figures 3A, 3B:
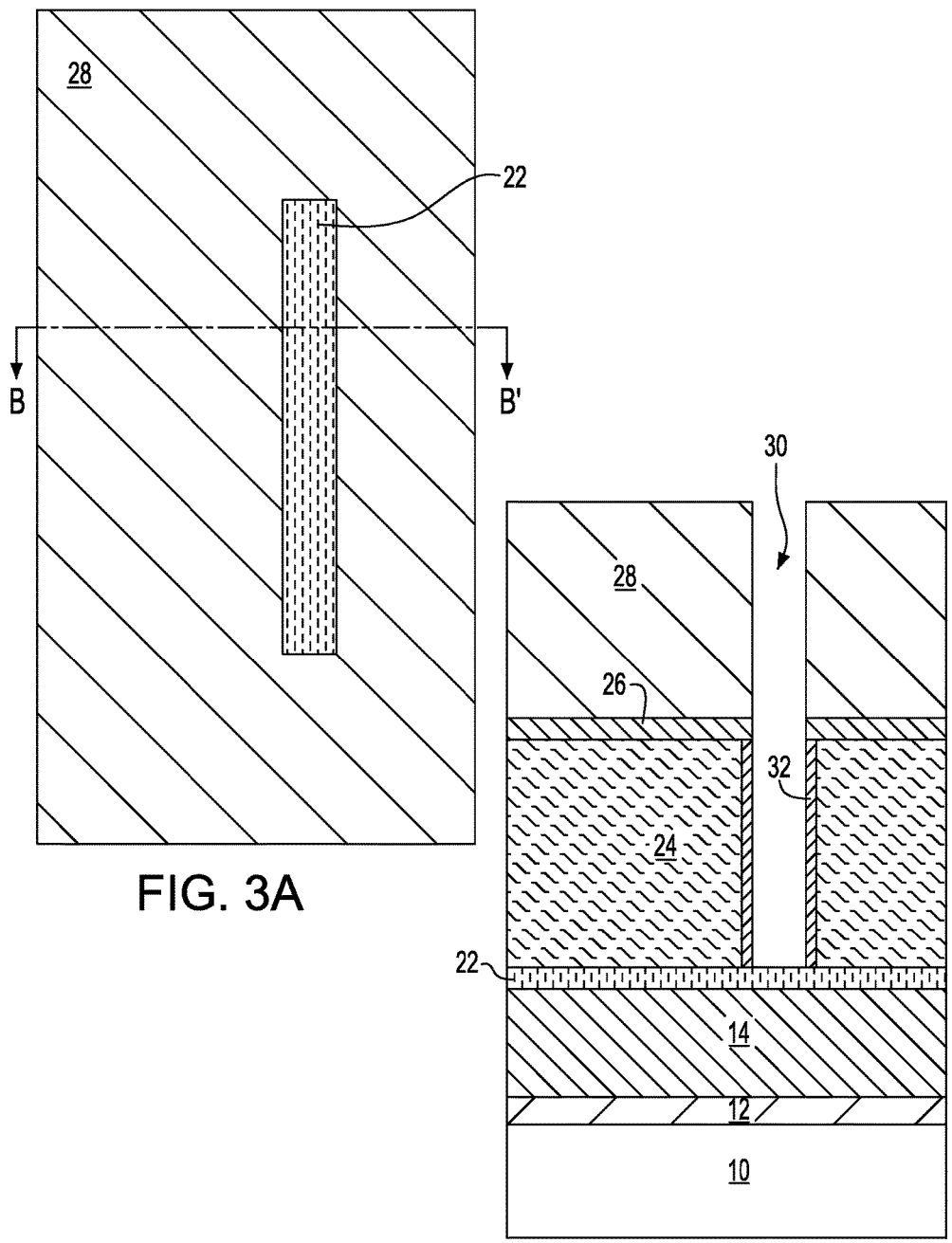
FIG. 3A is a top view of the exemplary semiconductor structure of FIGS. 2A and 2B after forming a protective layer on sidewalls of the sacrificial gate layer that are physically exposed by the trench.
FIG. 3B is a cross-sectional view of the exemplary semiconductor structure of FIG. 3A along line B-B'.

Referring now to FIGS. 2A and 2B, there are illustrated various views of the exemplary semiconductor structure of FIGS. 1A and 1B after forming a trench 30 within which a diode is to be subsequently formed. The trench 30 extends through the dielectric capping layer 28, the top spacer layer 26, and the sacrificial gate layer 24, physically exposing a surface of the bottom spacer layer 22. For ease of illustration, a single trench 30 is shown in FIG. 3B. In practice, multiple trenches can be formed such that multiple diodes can be formed on the semiconductor substrate 10.

The trench 30 may be formed by applying a photoresist layer (not shown) over the dielectric capping layer 28 and then lithographically patterning the photoresist layer to form an opening therein. The pattern in the photoresist layer is subsequently transferred into the dielectric capping layer 28, the top spacer layer 26 and the sacrificial gate layer 24 to form the trench 30. In one embodiment, multiple etching processes may be performed to sequentially remove portions of the dielectric capping layer 28, the top spacer layer 26 and the sacrificial gate layer 24 that are not covered by the patterned photoresist layer. Each etch can be an anisotropic etch such as, for example, reactive ion etching (RIE). After formation of the trench 30, the patterned photoresist layer can be removed, for example, by ashing. The width of the trench 30 can be from 6 nm to 20 nm, although lesser and greater widths can also be employed.

Referring now to FIGS. 3A and 3B, there are illustrated various views of the exemplary semiconductor structures of FIGS. 2A and 2B after forming a protective layer 32 on sidewalls of the sacrificial gate layer 24 that are physically exposed by the trench 30. The protective layer 32 may be formed by oxidizing the exposed portions of the sacrificial gate layer 24. The oxidation may be performed by a plasma oxidation process or other oxidation processes known in the art.

Referring now to FIGS. 4A and 4B, there are illustrated various views of the exemplary semiconductor structures of FIGS. 3A and 3B after removing a portion of the bottom spacer layer 22 that is physically exposed by the trench 30. The physically exposed portion of the bottom spacer layer 22 may be removed by an anisotropic etch which can be a dry etch such as, for example, RIE or a wet etch. A surface 34 of the underlying doped bottom semiconductor layer 14 is thus physically exposed by the trench 30.

Figures 5A, 5B:
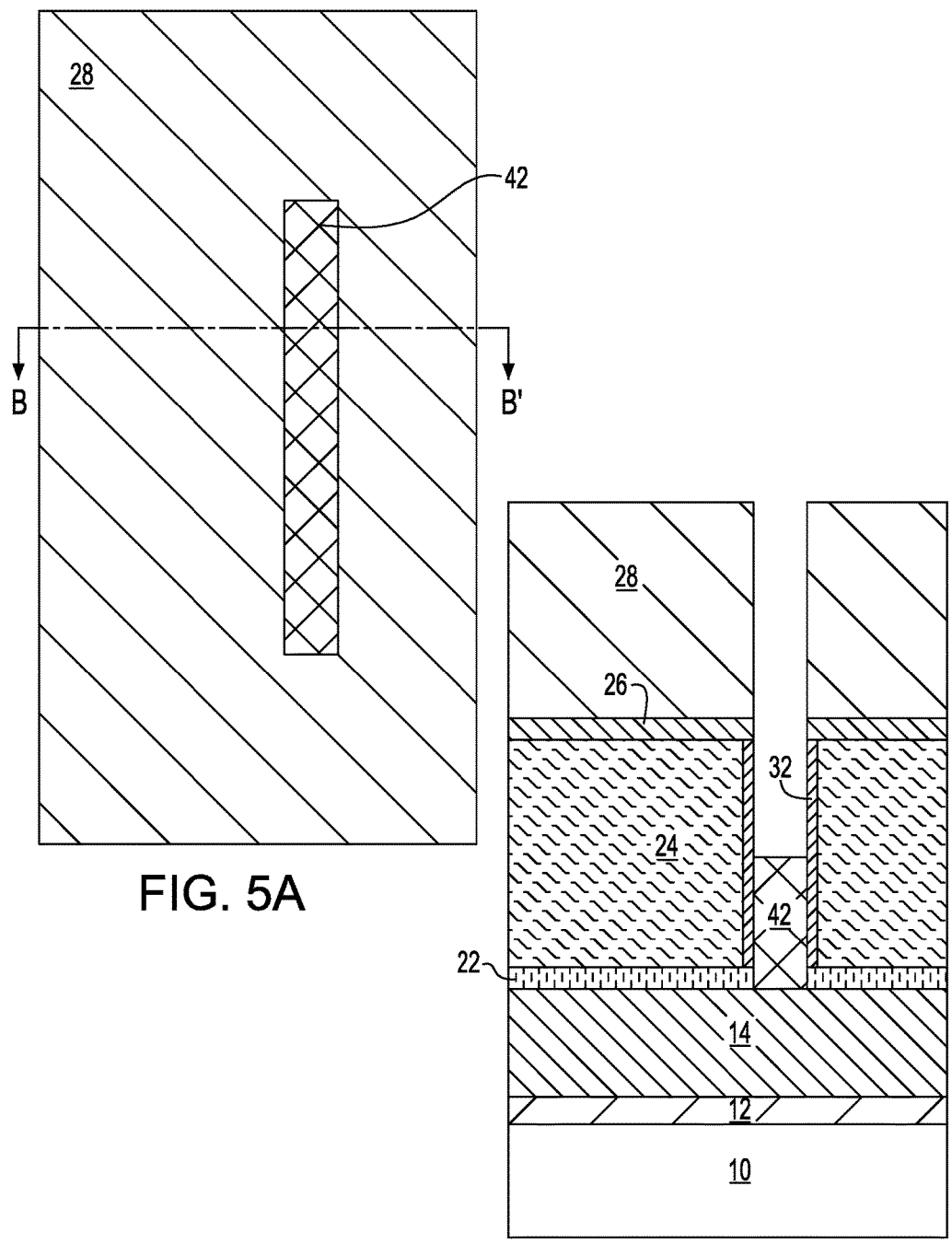
FIG. 5A is a top view of the exemplary semiconductor structure of FIGS. 4A and 4B after forming a first doped semiconductor segment on the physically exposed surface of the doped bottom semiconductor layer within the trench.
FIG. 5B is a cross-sectional view of the exemplary semiconductor structure of FIG. 5A along line B-B'.

Referring now to FIGS. 5A and 5B, there are illustrated various views of the exemplary semiconductor structures of FIGS. 4A and 4B after forming a first doped semiconductor segment 42 on the physically exposed surface 34 of the doped bottom semiconductor layer 14 within the trench 30.

The first doped semiconductor segment 42 may include a semiconductor material the same as, or different from, the semiconductor material that provides the doped bottom semiconductor layer 14. For example, the first doped semiconductor segment 42 may be composed of Si or SiGe. The first doped semiconductor segment 42 also contains a dopant having the same conductivity type as that of the dopant in the doped bottom semiconductor layer 14. In one embodiment, each of the doped bottom semiconductor layer and the first doped semiconductor segment 42 includes a p-type dopant.

The first doped semiconductor segment 42 may be formed by a selective epitaxial growth process. The selective epitaxial growth process deposits the semiconductor material that provides the first doped semiconductor segment 42 only on the semiconductor surface (i.e., physically exposed surface 34 of the doped bottom semiconductor layer 14), but not on dielectric surfaces, such as the bottom and top spacer layers 22, 26, the dielectric capping layer 28 and the protective layer 32. In one embodiment, the first doped semiconductor segment 42 is formed by MOCVD.

The dopant can be provided during the epitaxial growth process by in-situ doping, or after epitaxial growth process by ion implantation or gas phase doping. The dopant concentration can be from $1 \times 10^{17}$ atoms/cm$^3$ to $1 \times 10^{19}$ atoms/cm$^3$. In some embodiments, a timed epitaxial growth process can be used such that the deposition only partially fills the trench 30. A recess etch may then be used to remove a topmost portion of the deposited semiconductor material so as to provide the first doped semiconductor segment 42. A top surface of the first doped semiconductor segment 42 is thus located below the bottom surface of the top spacer layer 22. In various embodiments, the first doped semiconductor segment 42 may have a height in the range of about one third to about two-thirds of the sacrificial gate layer thickness, or have a height approximately to the midpoint of the sacrificial gate layer 24.

Figure 6A:
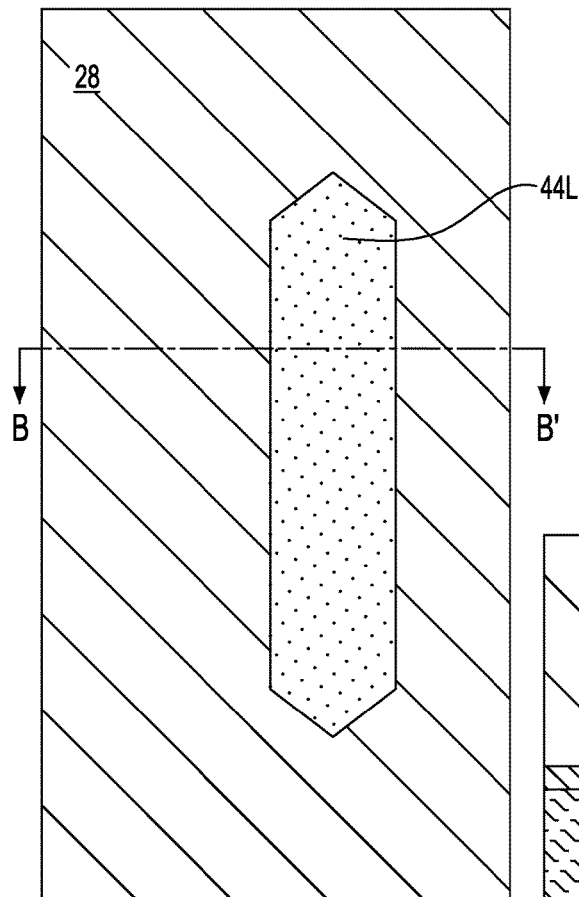
FIG. 6A is a top view of the exemplary semiconductor structure of FIGS. 5A and 5B after forming a second doped semiconductor layer on the first doped semiconductor segment within the trench.
Figure 6B:
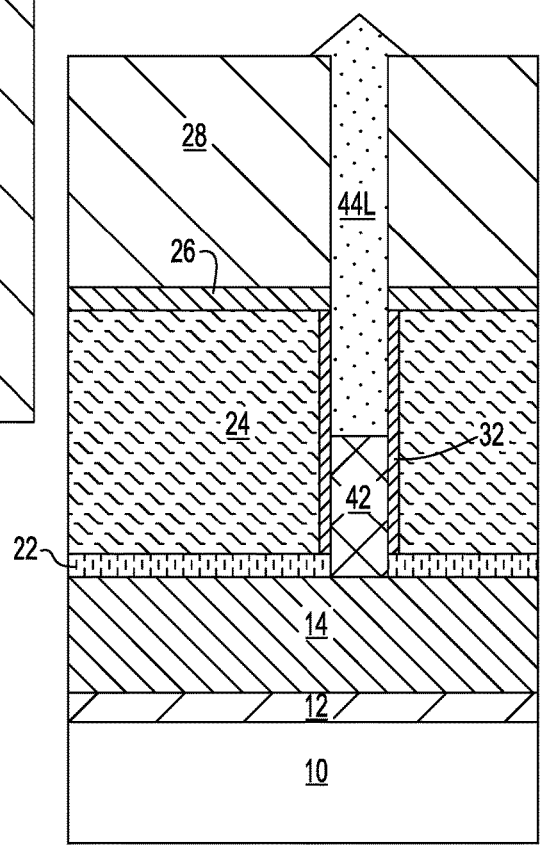
FIG. 6B is a cross-sectional view of the exemplary semiconductor structure of FIG. 6A along line B-B'.

Referring now to FIGS. 6A and 6B, there are illustrated various views of the exemplary semiconductor structures of FIGS. 5A and 5B after forming a second doped semiconductor layer 44L on the first doped semiconductor segment 42. The second doped semiconductor segment layer 44L may include a semiconductor material the same as, or different from, the semiconductor material that provides the first doped semiconductor segment 42. For example, the second doped semiconductor layer 44L may be composed of Si or SiGe. The second doped semiconductor layer 44L also contains a dopant having a conductivity type opposite to that of the dopant in the first doped semiconductor segment 42. In one embodiment and when the first dopant semiconductor segment 42 contains a p-type dopant, the second dopant semiconductor layer 44L contains an n-type dopant, and vice versa. A p-n junction is thus present at the interface between the second doped semiconductor layer 44L and the first doped semiconductor segment 42. The dopant concentration in the second doped semiconductor layer 44L can be from $1 \times 10^{19}$ atoms/cm$^3$ to $4 \times 10^{20}$ atoms/cm$^3$.

The second doped semiconductor layer 44L may be formed by a selective epitaxial growth process described above in formation of the first doped semiconductor segment 42. The second doped semiconductor layer 44L may be epitaxially grown to a height that extends above the top surface of the dielectric capping layer, and expand laterally due to different growth rates of the crystal faces. In one embodiment and as is shown, the second doped semiconductor layer 44L has a top surface that extends above the top surface of the dielectric capping layer 28 and is chevron shaped. By "chevron shaped" it is meant that the second doped semiconductor layer 44L has a top surface that is bound by 111-planes (and is thus has an inverted V-shaped pattern).

Figure 7A:
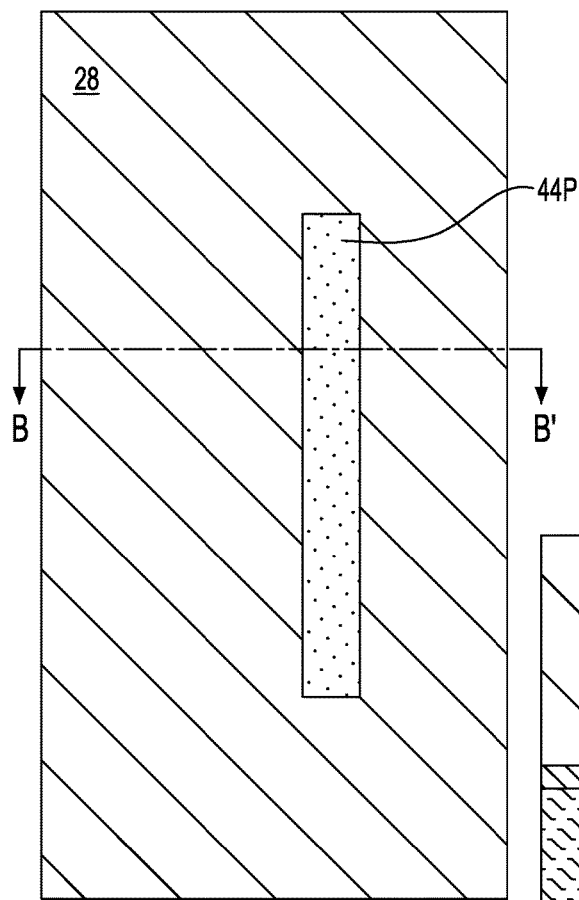
FIG. 7A is a top view of the exemplary semiconductor structure of FIGS. 6A and 6B after planarizing the second doped semiconductor layer to form a second doped semiconductor portion.
Figure 7B:
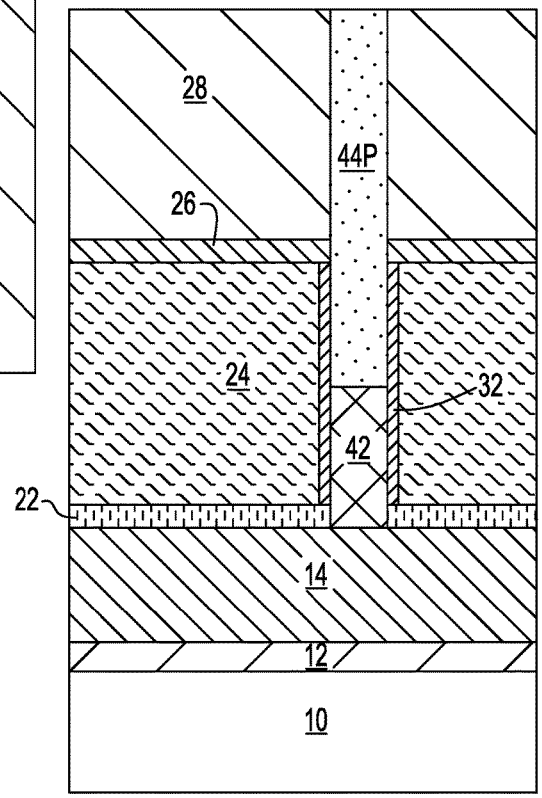
FIG. 7B is a cross-sectional view of the exemplary semiconductor structure of FIG. 7A along line B-B'.

Referring now to FIGS. 7A and 7B, there are illustrated various views of the exemplary semiconductor structures of FIGS. 6A and 6B after forming a second doped semiconductor portion 44P by performing a planarization process. The planarization process removes the top portion of the second doped semiconductor layer 44L from the top surface of the dielectric capping layer 28. The planarization process may include chemical mechanical planarization (CMP) and/or grinding. After planarization, a remaining portion of the second doped semiconductor layer 44L constitutes the second doped semiconductor portion 44. A top surface of the second doped semiconductor portion 44P thus formed is coplanar with the top surface of the dielectric capping layer 28.

Figure 8A:
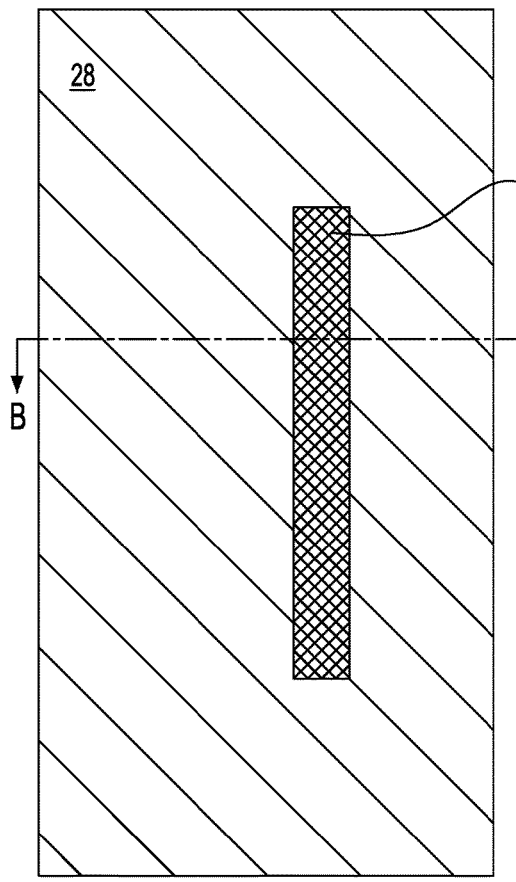
FIG. 8A is a top view of the exemplary semiconductor structure of FIGS. 7A and 7B after forming a second doped semiconductor segment and forming a dielectric cap thereon.
Figure 8B:
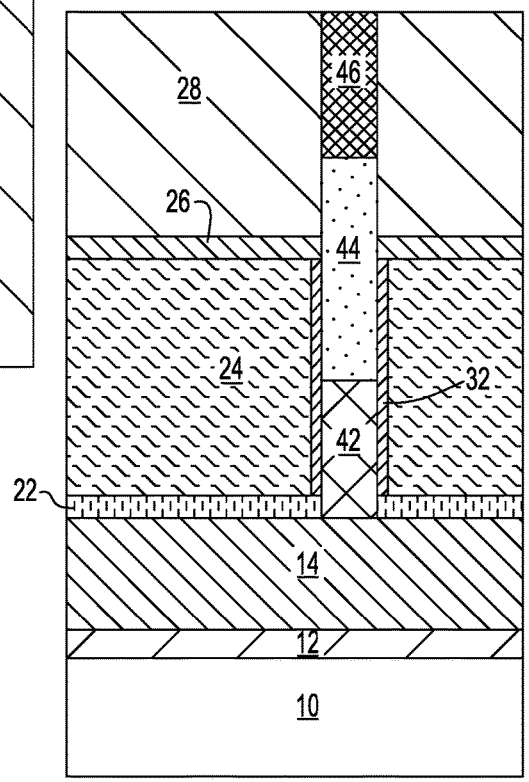
FIG. 8B is a cross-sectional view of the exemplary semiconductor structure of FIG. 8A along line B-B'.

Referring now to FIGS. 8A and 8B, there are illustrated various views of the exemplary semiconductor structures of FIGS. 7A and 7B after recessing the second doped semiconductor portion 44P to form a second doped semiconductor segment 44 within the trench 30 and then forming a dielectric cap 46 atop the second doped semiconductor segment 44.

The second doped semiconductor portion 44P may be recessed by an anisotropic etch. The anisotropic etch can be a dry etch such as RIE or a wet etch which recesses the second doped semiconductor portion 44P selective to the dielectric capping layer 28. After etching, a remaining portion of the second doped semiconductor portion 44P constitutes the second doped semiconductor segment 44. A top surface of the second doped semiconductor segment 44 is located between the top surface of the dielectric capping layer 28 and the bottom surface of the dielectric capping layer 28. Thus, a void (not shown) is formed over the second doped semiconductor segment 44 within the trench 30.

Next, a dielectric material is deposited to fill the void. The dielectric material may be a dielectric oxide (e.g., silicon dioxide), a dielectric nitride (e.g., silicon nitride), a dielectric oxynitride, or any combination thereof. The dielectric material may be deposited by a deposition process such as, for example, CVD or PVD. After deposition, the excess dielectric material can be removed from the top surface of the dielectric capping layer 28 by a planarization process such as, for example, by CMP, thus providing the dielectric cap 46. The top surface of the dielectric cap 46 is coplanar with the top surface of the dielectric capping layer 28.

Figure 9A:
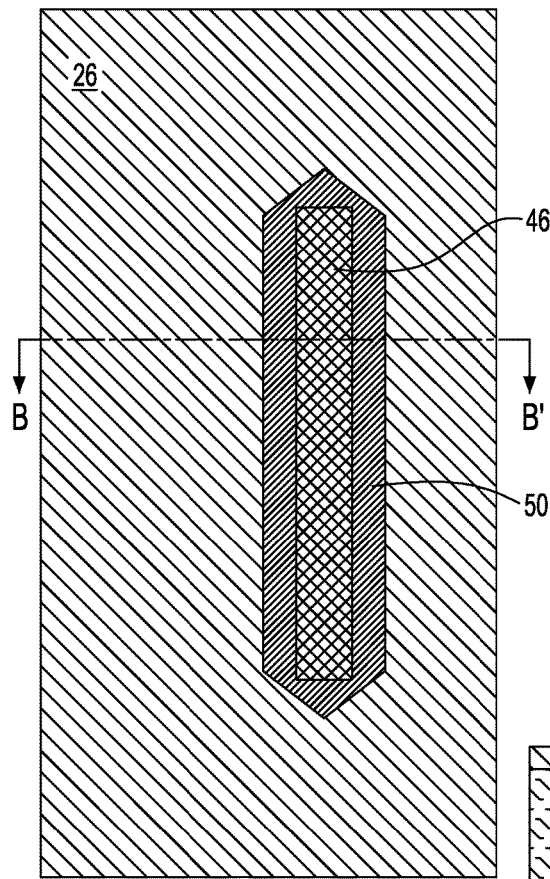
FIG. 9A is a top view of the exemplary semiconductor structure of FIGS. 8A and 8B after removing the dielectric capping layer and forming a doped top semiconductor region on sidewalls of an exposed top portion of the second doped semiconductor segment.
Figure 9B:
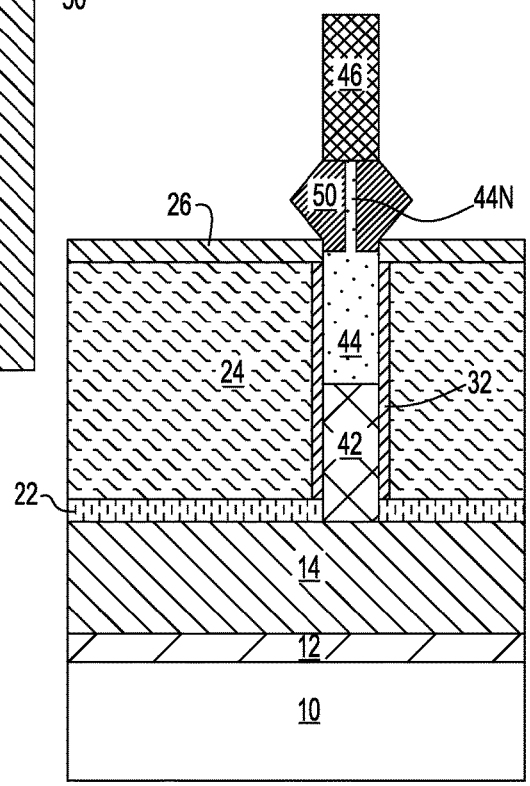
FIG. 9B is a cross-sectional view of the exemplary semiconductor structure of FIG. 9A along line B-B'.

Referring now to FIGS. 9A and 9B, there are illustrated various views of the exemplary semiconductor structures of FIGS. 8A and 8B after removing the dielectric capping layer 28 and then forming a doped top semiconductor region 50 on sidewalls of the exposed top portion of the second doped semiconductor segment 44.

The dielectric capping layer 28 may be removed by an etch. The etch can be an isotropic etch or an anisotropic etch that removes the dielectric capping layer 28 selective to the top spacer layer 26, the dielectric cap 46 and the second doped semiconductor segment 44. In one embodiment, a wet etch process using diluted hydrofluoric acid can be performed to remove the dielectric capping layer 28. The removal of the dielectric capping layer 28 exposes sidewalls of the dielectric cap 46 and sidewalls of a top portion of the second doped semiconductor segment 44 previously covered by the dielectric capping layer 28.

In some embodiments of the present application, a lateral etch may be optionally performed to narrow the exposed top portion of the second doped semiconductor segment 44 to provide a narrowed top portion 44N within the second doped semiconductor segment 44. In one embodiment, the narrowed top portion 44N may have a width ranging from 2 nm to 5 nm. The lateral etch can be, for example, a wet etch. In some embodiments, the lateral etch may also remove a portion of the second doped semiconductor segment 44 located below the top surface of the top spacer layer 26. A bottom surface of the narrowed top portions 44N is thus located between the top surface of the top spacer layer 26 and the bottom surface of the top spacer layer 26.

The doped top semiconductor region 50 is then formed on sidewalls of the narrowed top portion 44N. The doped top semiconductor region 50 may include a semiconductor material that is the same as, or different from, the semiconductor material that provides the doped bottom semiconductor layer 14. The doped top semiconductor region 50 also contains a dopant having a conductivity type the same as that of the second doped semiconductor segment 44.

The doped top semiconductor region 50 may be formed utilizing a selective epitaxial growth process described above in formation of the first doped semiconductor segment 42. As shown, the doped top semiconductor region 50 may be formed with faceted surfaces. In some embodiments, the doped top semiconductor region 50 has triangular in shape with the base of the triangle located on the narrowed top portion 44N, and the tip extending laterally outward from the narrowed top portion 44N. The dopant can be provided during the epitaxial growth process by in-situ doping, or after epitaxial growth process by ion implantation or gas phase doping. The dopant concentration can be from $1 \times 10^{19}$ atoms/cm$^3$ to $4 \times 10^{20}$ atoms/cm$^3$. The doped top semiconductor region 50 serves as another anode/cathode for the diode.

Figure 10A:
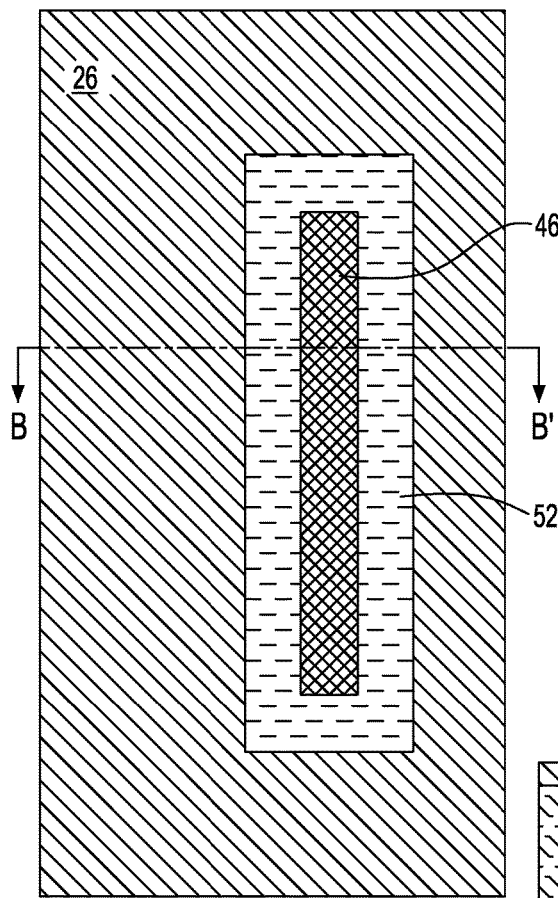
FIG. 10A is a top view of the exemplary semiconductor structure of FIGS. 9A and 9B after forming a sidewall spacer surrounding the doped top semiconductor region and the dielectric cap.
Figure 10B:
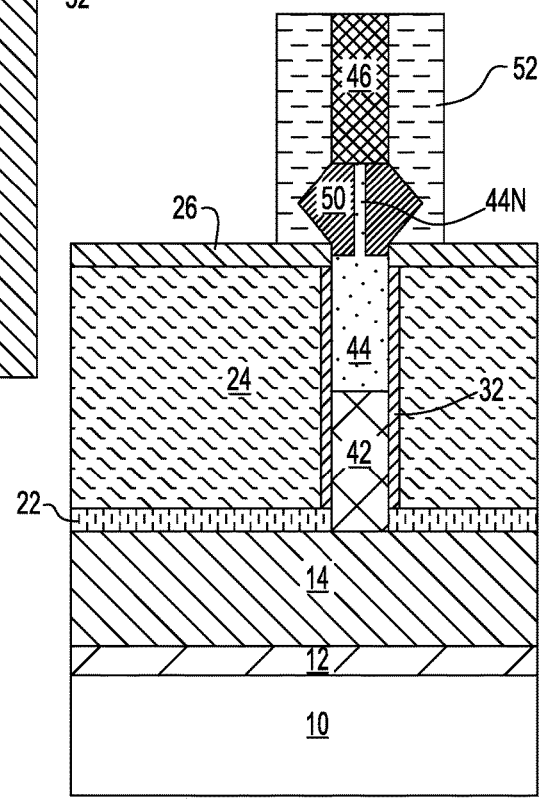
FIG. 10B is a cross-sectional view of the exemplary semiconductor structure of FIG. 10A along line B-B'.

Referring now to FIGS. 10A and 10B, there are illustrated various views of the exemplary semiconductor structures of FIGS. 9A and 9B after forming a sidewall spacer 52 surrounding the doped top semiconductor region 50 and the dielectric cap 46.

The sidewall spacer 52 may include a dielectric material such as, for example, silicon dioxide, silicon nitride, silicon oxynitride or a combination of. In one embodiment, the sidewall spacer 52 is composed of silicon nitride. The sidewall spacer 52 may be formed by conformally depositing a dielectric material on the physically exposed surfaces of the top spacer layer 26, the doped top semiconductor region 50, and the dielectric cap 46 using, for example, CVD or atomic layer deposition (ALD). Horizontal portions of the deposited dielectric material are subsequently removed, for example, by an anisotropic etch. The anisotropic etch can be a dry etch such as, for example, RIE or a wet etch. After etching, the remaining vertical portion of the deposited dielectric material present on the sidewall surfaces of the doped top semiconductor region 50 and the dielectric cap 46 constitute the sidewall spacer 52. The width of the sidewall spacers 52, as measured from its base, can be from 5 nm to 25 nm, although lesser and greater widths can also be employed. As shown, a bottom surface of sidewall spacer 52 is in direct contact with the top surface of the top spacer layer 26.

Figure 11A:
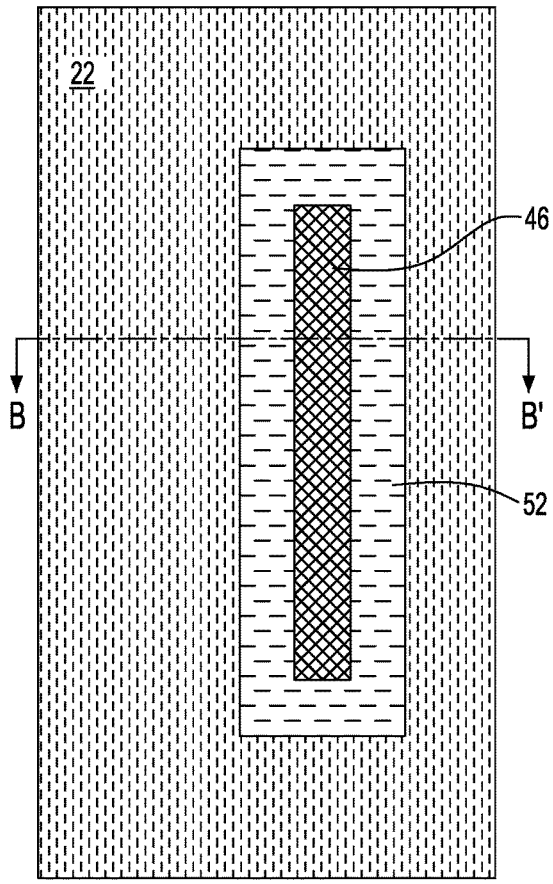
FIG. 11A is a top view of the exemplary semiconductor structure of FIGS. 10A and 10B after forming a top spacer and a sacrificial gate portion.
Figure 11B:
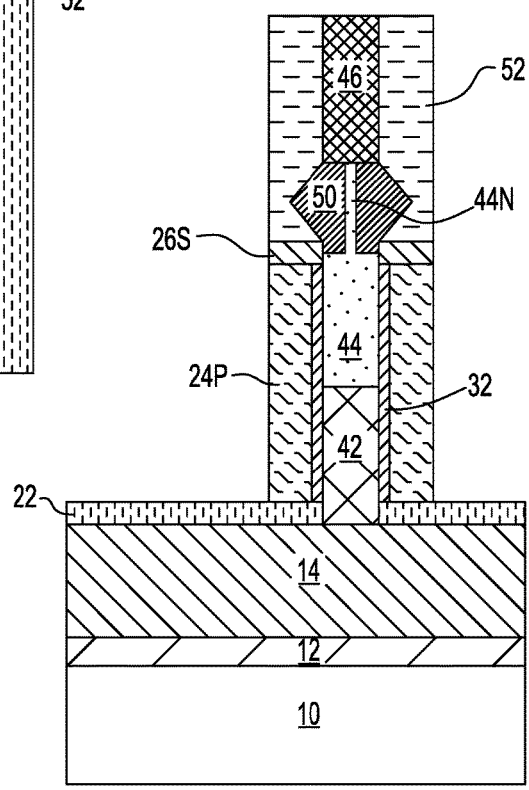
FIG. 11B is a cross-sectional view of the exemplary semiconductor structure of FIG. 11A along line B-B'.

Referring now to FIGS. 11A and 11B, there are illustrated various views of the exemplary semiconductor structures of FIGS. 10A and 10B after sequentially removing portions of the top spacer layer 26 and the sacrificial gate layer 24 that are not covered by the sidewall spacer 52 by directional etching. For example, a first anisotropic etch process such as RIE may be performed to etch the physically exposed portion of the top spacer layer 26 not underlying the sidewall spacer 52 selective to the sacrificial gate layer 24. Then a second anisotropic etch process may be performed to etch portions of the sacrificial gate layer 24 not underlying the sidewall spacer 52 selective to the bottom spacer layer 22. A remaining portion of the top spacer layer 26 underneath the sidewall spacer 52 constitutes a top spacer 26S, and a remaining portion of the sacrificial gate layer 24 underneath the top spacer 26S constitutes a sacrificial gate portion 24P.

Figures 12A, 12B:
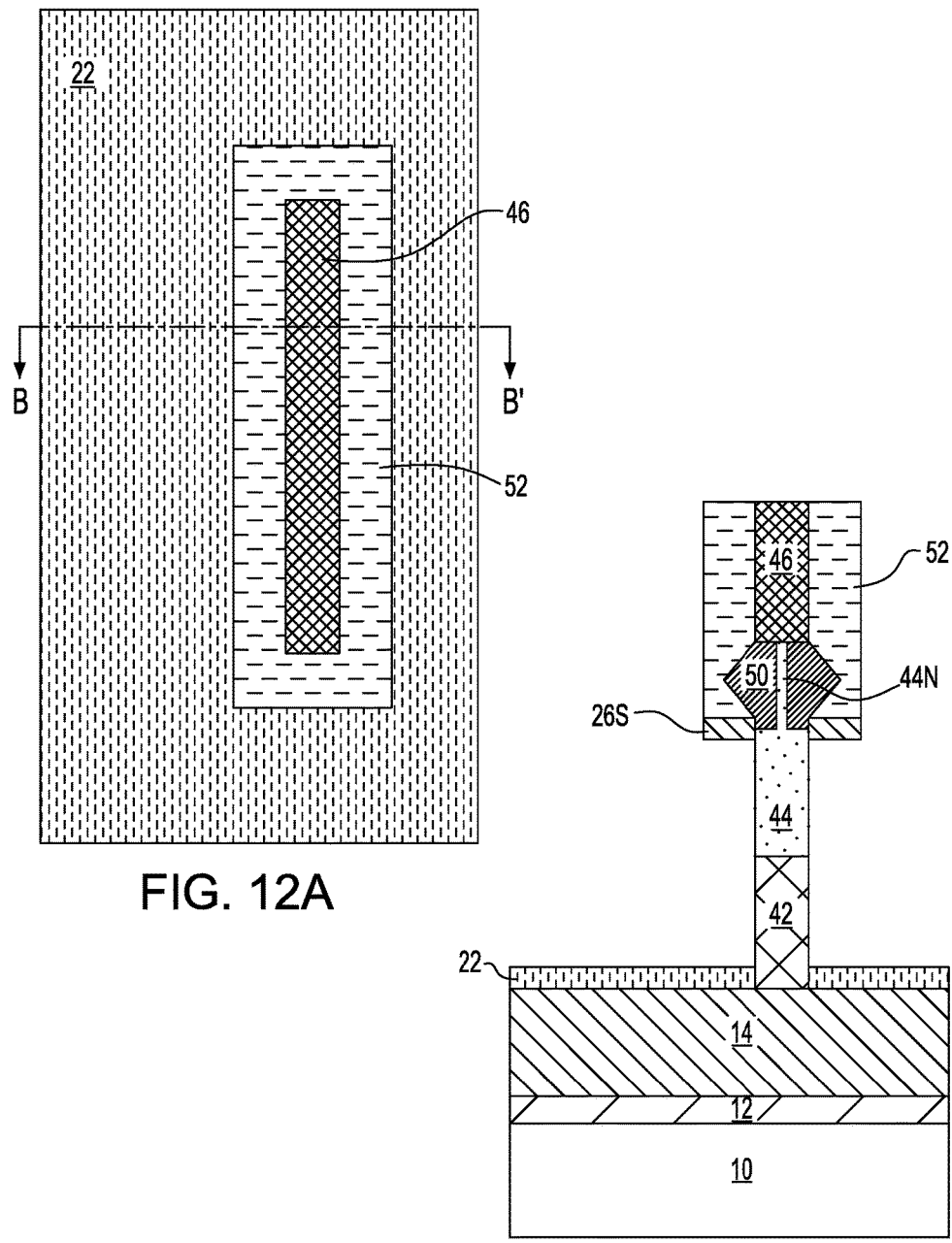
FIG. 12A is a top view of the exemplary semiconductor structure of FIGS. 11A and 11B after removing the sacrificial gate portion and the protective layer.
FIG. 12B is a cross-sectional view of the exemplary semiconductor structure of FIG. 12A along line B-B'.

Referring now to FIGS. 12A and 12B, there are illustrated various views of the exemplary semiconductor structures of FIGS. 11A and 11B after sequentially removing the sacrificial gate portion 24P and the protective layer 32 by etching. For example, a first isotropic etch process such as a wet etch or RIE may be performed to remove the sacrificial gate portion 24P selective to the protective layer 32, the top spacer 26S, the bottom spacer layer 22, the sidewall spacer 52, and the dielectric cap 46. Next, a second isotropic etch process may be performed to remove the protective layer 32 selective to the first doped semiconductor segment 42, the second doped semiconductor segment 44, the top spacer 26S, the bottom spacer layer 22, the sidewall spacer 52, and the dielectric cap 46. The removal of the protective layer 32 exposes an upper portion of the first doped semiconductor segment 42 and a lower portion of the second doped semiconductor segment 44 previously covered by the protective layer 32.

Figure 13A:
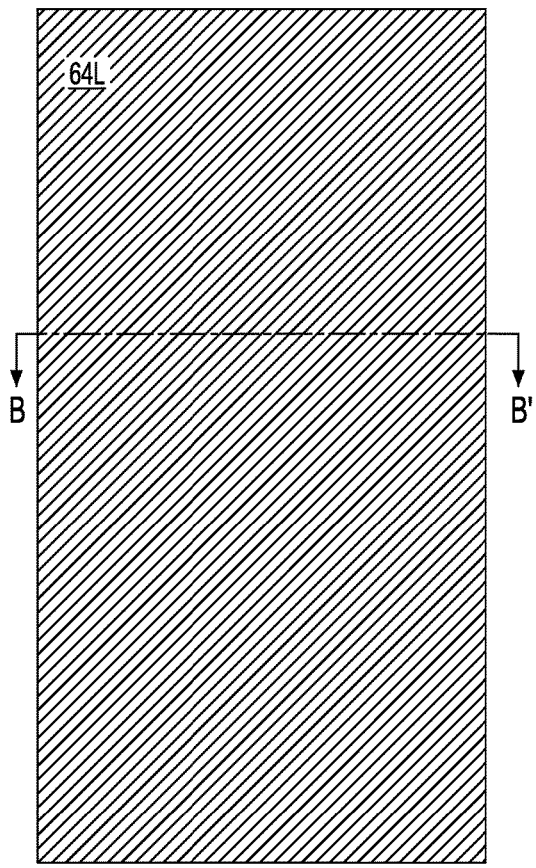
FIG. 13A is a top view of the exemplary semiconductor structure of FIGS. 12A and 12B after forming a gate dielectric layer and a work function metal layer.
Figure 13B:
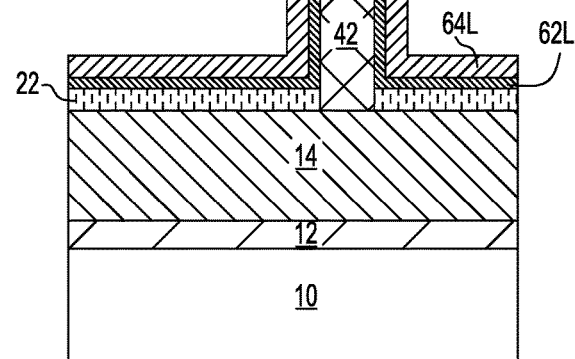
FIG. 13B is a cross-sectional view of the exemplary semiconductor structure of FIG. 13A along line B-B'.

Referring now to FIGS. 13A and 13B, there are illustrated various views of the exemplary semiconductor structures of FIGS. 12A and 12B after forming a gate dielectric layer 62L on exposed surfaces of the bottom spacer layer 22, the first doped semiconductor segment 42, the second doped semiconductor segment 44, the top spacer 26S, the sidewall spacer 52, and the dielectric cap 46, and then forming a work function metal layer 64L on the gate dielectric layer 62L.

The gate dielectric layer 62L may include a high-k dielectric material having a dielectric constant greater than silicon oxide. Exemplary high-k dielectric materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multiple gate dielectric layers comprising different gate dielectric materials, e.g., silicon dioxide, and a high-k gate dielectric material can be formed. The gate dielectric layer 62 may be formed by a conformal deposition technique including, for example, CVD, PECVD, PVD and ALD. The thickness of the gate dielectric layer 62L can be from 1 nm to 10 nm, although lesser and greater thicknesses can also be employed.

The work function metal layer 64L may include a metal nitride, a metal carbide or a combination thereof. Exemplary metal nitrides that can be employed include, but are not limited to, TiN, HfN, HfSiN, TaN, TaSiN, WN, MoN and NbN. Exemplary metal carbides that can be employed include, but are not limited to, TiC, TaC and HfC. The work functional metal layer 64L may be formed by a conformal deposition technique including, for example, CVD, PECVD, PVD and ALD. The thickness of the work function metal layer 64: can be from 1 nm to 10 nm, although lesser and greater thicknesses can also be employed.

Figure 14A:
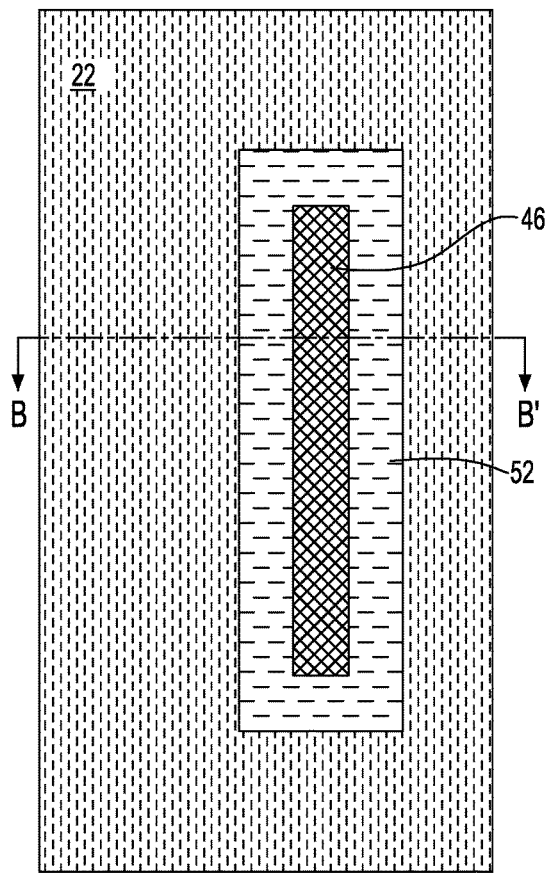
FIG. 14A is a top view of the exemplary semiconductor structure of FIGS. 13A and 13B after forming a gate dielectric and a work function metal contacting sidewalls of the first and second doped semiconductor segments.
Figure 14B:
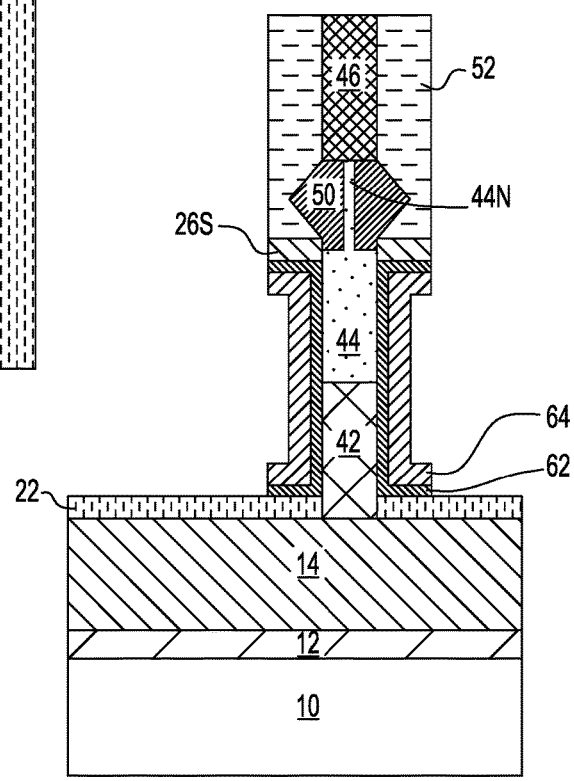
FIG. 14B is a cross-sectional view of the exemplary semiconductor structure of FIG. 14A along line B-B'.

Referring now to FIGS. 14A and 14B, there are illustrated various views of the exemplary semiconductor structures of FIGS. 13A and 13B after removing portions of the work function metal layer 64L and the gate dielectric layer 62L not underlying the sidewall spacer 52 by multiple etching processes. For example, a first etching process is performed to etch the work functional metal layer 64L selective to the gate dielectric layer 62L, and a second etching process is then performed to etch the gate dielectric layer 62L selective to the bottom spacer layer 22, the top spacer 26S, the sidewall spacer 52, and the dielectric cap 46. In one embodiment, each of the first etching process and the second etching process can be a dry etch such as, for example, RIE. A remaining portion of the gate dielectric layer 62L constitutes a gate dielectric 62 laterally contacting sidewalls of the first doped semiconductor segment 42 and the second doped semiconductor segment 44, and a remaining portion of the work function metal layer 64L constitutes a work function metal 64 overlying the gate dielectric 62.

Figures 15A, 15B:
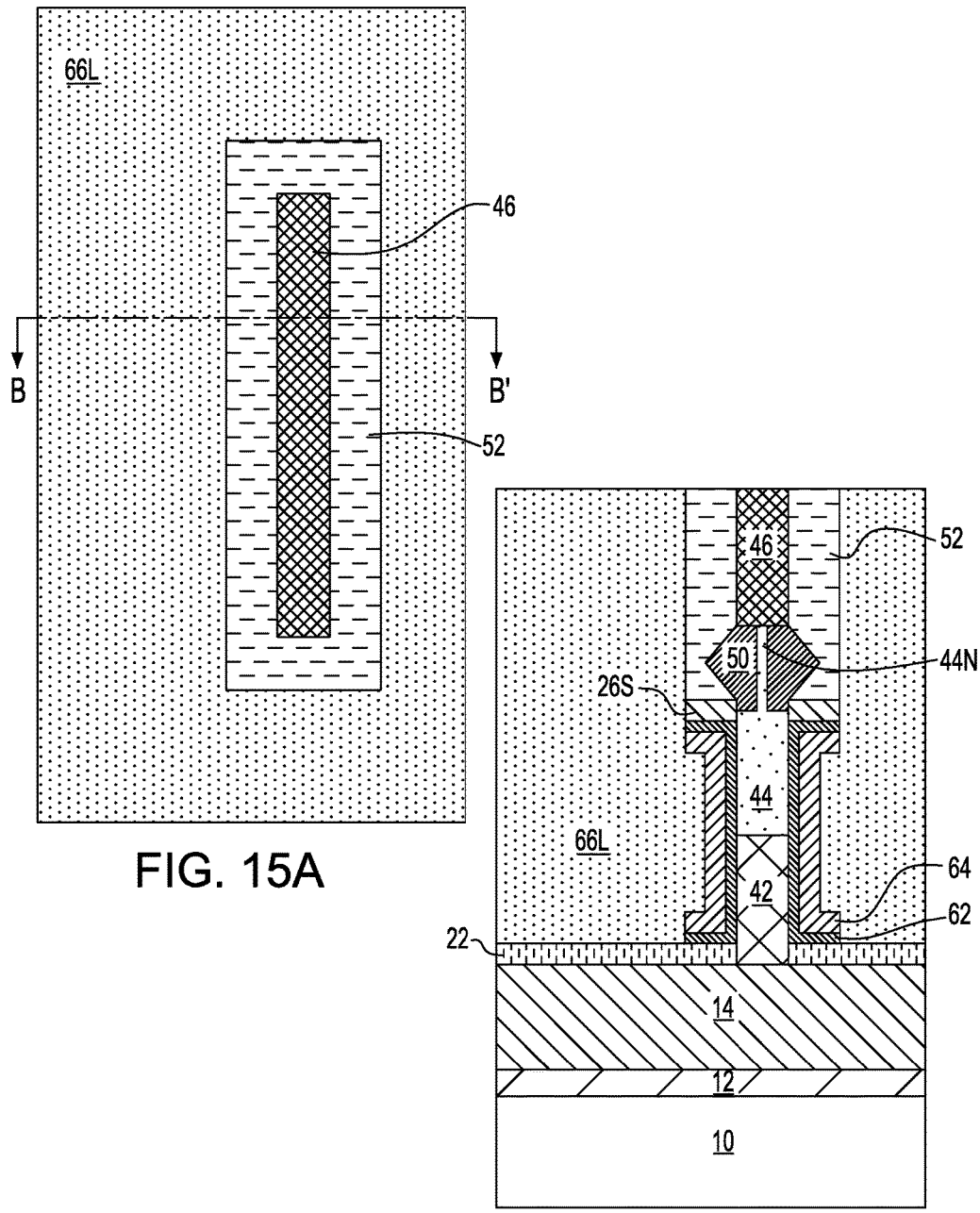
FIG. 15A is a top view of the exemplary semiconductor structure of FIGS. 14A and 14B after forming a gate electrode layer.
FIG. 15B is a cross-sectional view of the exemplary semiconductor structure of FIG. 15A along line B-B'.

Referring now to FIGS. 15A and 15B, there are illustrated various views of the exemplary semiconductor structures of FIGS. 14A and 14B after forming a gate electrode layer 66L on the bottom spacer layer 22. The gate electrode layer 66L laterally contacts the gate dielectric 62, the work function metal 64, the top spacer 26S, and the sidewall spacer 52.

The gate electrode layer 66L may include any conductive metal material including, for example, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. The gate electrode layer 66L may be formed utilizing a deposition process including, for example, CVD, PECVD, PVD, ALD and other like deposition processes. When a metal silicide is formed, a conventional silicidation process is employed. A planarization process, for example, CMP, may be performed to polish the surface of the gate electrode layer 66L. After planarization, the top surface of the gate electrode layer 66L is coplanar with the top surfaces of the sidewall spacer 52 and the dielectric cap 46.

Figure 16A:
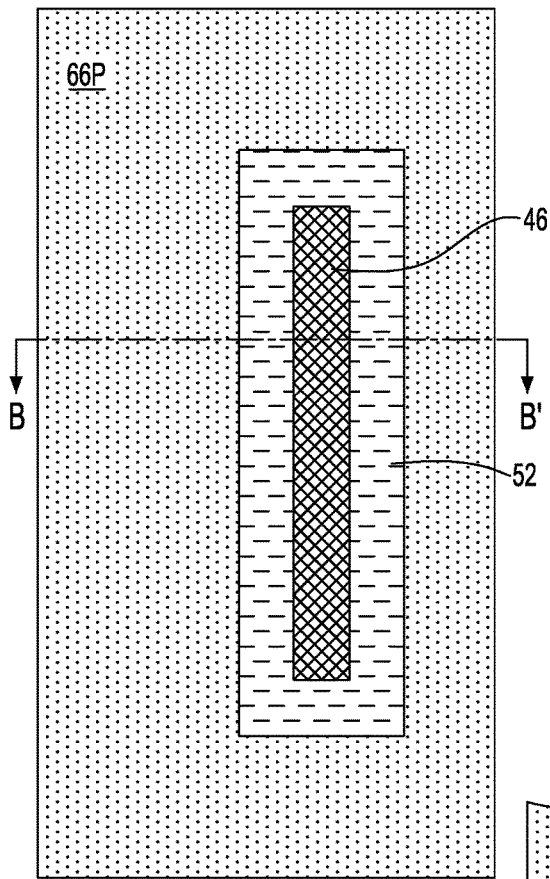
FIG. 16A is a top view of the exemplary semiconductor structure of FIGS. 15A and 15B after forming a gate electrode portion.
Figure 16B:
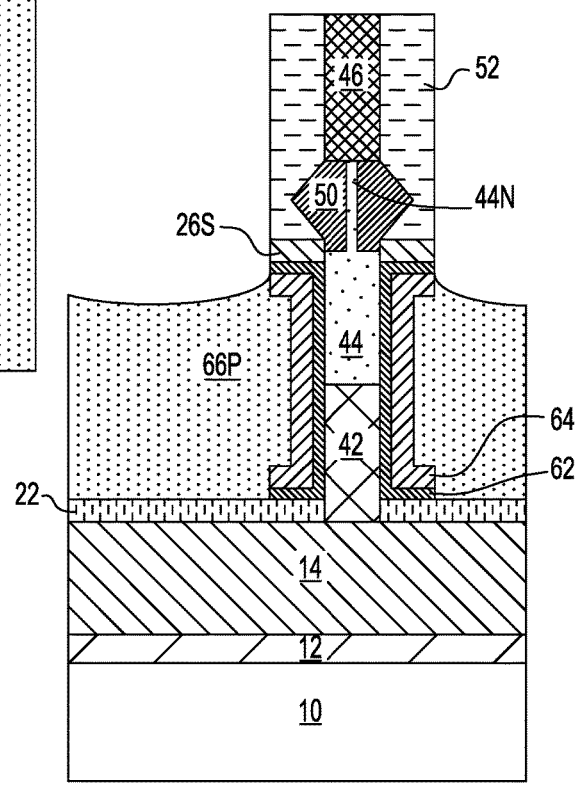
FIG. 16B is a cross-sectional view of the exemplary semiconductor structure of FIG. 16A along line B-B'.

Referring now to FIGS. 16A and 16B, there are illustrated various views of the exemplary semiconductor structures of FIGS. 15A and 15B after recessing the gate electrode layer 66L below a bottom surface of the top spacer 26. In one embodiment, an anisotropic etch such as RIE may be performed to recess the metal gate electrode layer 66L. A remaining portion of the gate electrode layer 66L that laterally contacts the gate dielectric 62 and the work function metal 64 is herein referred to as a gate electrode portion 66P. The top surface the metal gate electrode portion 66P is coplanar with, or below the topmost surface of the work function metal 64.

Figure 17A:
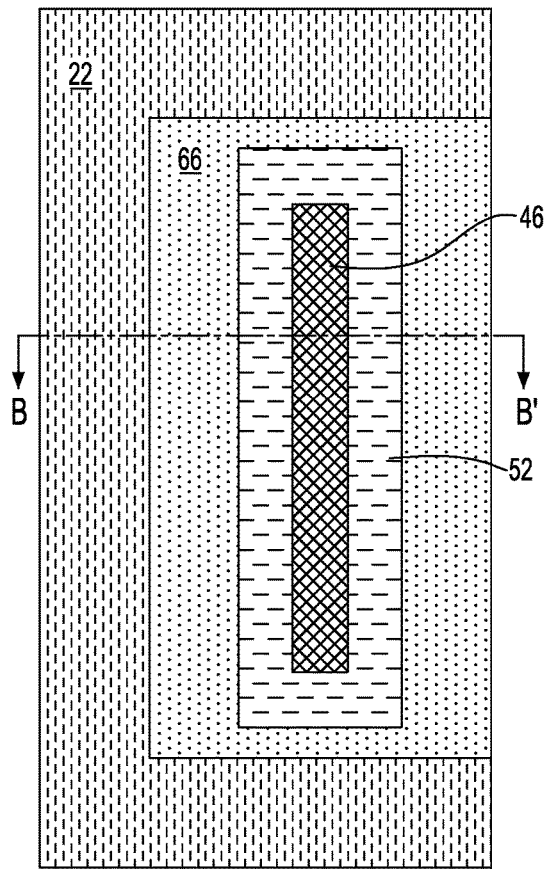
FIG. 17A is a top view of the exemplary semiconductor structure of FIGS. 16A and 16B after forming a gate electrode.
Figure 17B:
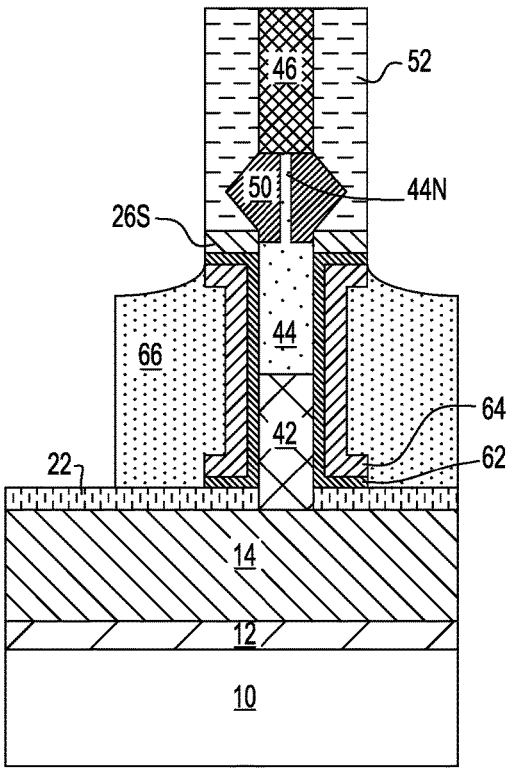
FIG. 17B is a cross-sectional view of the exemplary semiconductor structure of FIG. 17A along line B-B'.

Referring now to FIGS. 17A and 17B, there are illustrated various views of the exemplary semiconductor structures of FIGS. 16A and 16B after removing an end portion of the gate electrode portion 66P to provide a gate electrode 66. The removal of the end portion of the gate electrode portion 66P re-exposes a portion of the bottom spacer layer 22 underlying the end portion of the gate electrode portion 66P.

The end portion of the gate electrode portion 66P can be removed by lithography and patterning. For example, a mask layer (not shown) can be first applied on the gate electrode portion 66P, the sidewall spacer and the dielectric cap 46 and lithographically patterned to expose the end portion of the gate electrode portion 66P. The mask layer may be a photoresist layer or a photoresist layer in conjunction with hard mask layer(s). The physically exposed end portion of the gate electrode portion 66P is then removed by an anisotropic etch (e.g., RIE). A remaining portion of the gate electrode portion 66P constitutes the gate electrode 66. The gate electrode 66 together with the gate dielectric 62 and the work function metal 64 provide a gate structure for the diode. After forming the gate electrode 66, the remaining portion of the mask layer can be removed, for example, by oxygen-based plasma etching.

A vertical gated diode thus is formed. The vertical gated diode includes a vertical stack of a first doped semiconductor segment 42 and a second doped semiconductor segment 44 extending from a surface of a doped bottom semiconductor layer 14, a doped top semiconductor region 50 laterally surrounding a top portion of the second doped semiconductor segment 44, and a gate structure (62, 64, 66) laterally surrounding the first doped semiconductor segment 42 and the second doped semiconductor segment 44. The doped bottom semiconductor layer 14 serves as an anode/cathode, and the doped top semiconductor region 50 serves as another anode/cathode for the vertical gated diode.

The processing steps described above for the formation of vertical diodes is compatible with the gate-last flow for formation of vertical FETs. The only difference is that in the present application, because a p-n junction is needed for a vertical gated diode, two epitaxial growth processes are performed to epitaxially growing a first doped semiconductor segment 42 and a second doped semiconductor portion 44P of different conductivity type within a trench 30, while because no such p-n junction is required for a vertical FET, a single epitaxial growth process is performed for epitaxially growing a semiconductor fin within a trench. The method of the present application thus is efficient in co-integration of vertical gated diodes with vertical FETs since only simple medications for gate-last process flow used for formation of vertical FETs are required for formation of vertical gated diodes.

Figures 18A, 18B:
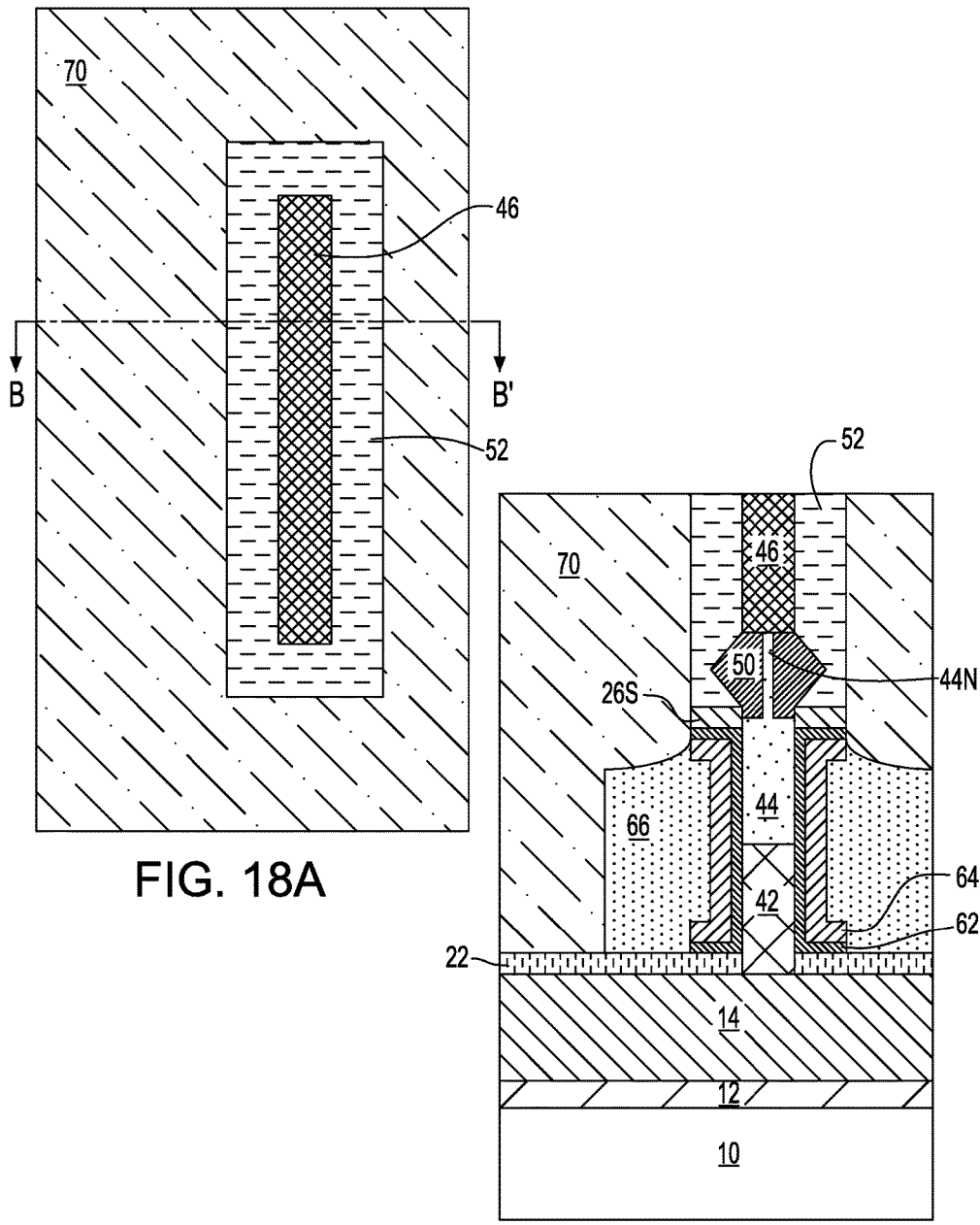
FIG. 18A is a top view of the exemplary semiconductor structure of FIGS. 17A and 17B after forming an interlevel dielectric (ILD) layer.
FIG. 18B is a cross-sectional view of the exemplary semiconductor structure of FIG. 18A along line B-B'.

Referring now to FIGS. 18A and 18B, there are illustrated various views of the exemplary semiconductor structures of FIGS. 17A and 17B after forming an interlevel dielectric (ILD) layer 70 on the bottom spacer layer 22 and the gate electrode 66. The ILD layer 70 laterally surrounds the sidewall spacer 52 and the top spacer 26S. The ILD layer 70 may be formed from, for example, a low-k dielectric material (with k<4.0), including but not limited to, silicon oxide, spin-on-glass, a flowable oxide, a high density plasma oxide, borophosphosilicate glass (BPSG) or any combination thereof. The ILD layer 70 may be deposited, for example, by CVD, PVD or spin coating. The ILD layer 70 can be initially formed such that an entirety of the top surface of the ILD layer 70 is formed above the top surfaces of the sidewall spacer 52 and the dielectric cap 46. The ILD layer 70 can be subsequently planarized, for example, by CMP and/or a recess etch using the top surfaces of the sidewall spacer 52 and the dielectric cap 46 as a polishing and/or an etch stop. After planarization, the top surface of the ILD layer 70 is coplanar with the top surfaces of the top surfaces of the sidewall spacer 52 and the dielectric cap 46.

Figures 19A, 19B:
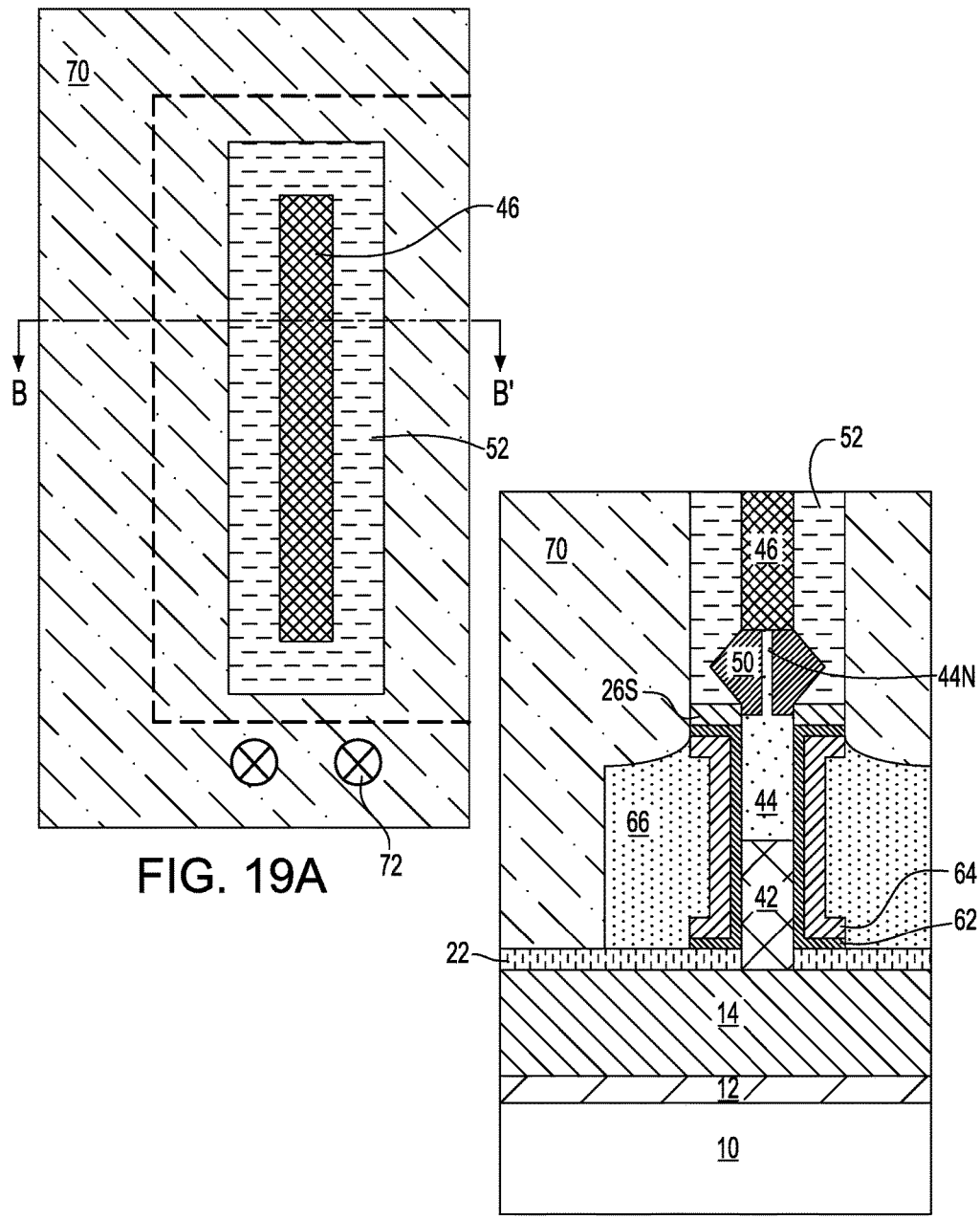
FIG. 19A is a top view of the exemplary semiconductor structure of FIGS. 18A and 18B after forming first anode/cathode contact structures contacting the doped bottom semiconductor portion layer.
FIG. 19B is a cross-sectional view of the exemplary semiconductor structure of FIG. 19A along line B-B'.

Referring now to FIGS. 19A and 19B, there are illustrated various views of the exemplary semiconductor structures of FIGS. 18A and 18B after forming one or more first anode/cathode contact structures 72. The first anode/cathode contact structures 72 extend through the ILD layer 70 and the bottom spacer layer 22 to form contact with the doped bottom semiconductor portion layer 14.

The first anode/cathode contact structures 72 can be formed by formation of contact openings (not shown) utilizing a combination of lithographic patterning and anisotropic etch followed by deposition of a conductive material such as, for example, Al, Pt, Au, Cu or W. The conductive material may be deposited by a suitable deposition process, for example, CVD, PECVD, PVD or plating. A planarization process, for example, CMP, is performed to remove any conductive material from the top surfaces of the ILD layer 70.

Optionally, contact liners (not shown) may be formed on the sidewalls and bottoms surfaces of contact openings before filling the contact openings with the conductive material. The contact liners may include TiN.

Figures 20A, 20B:
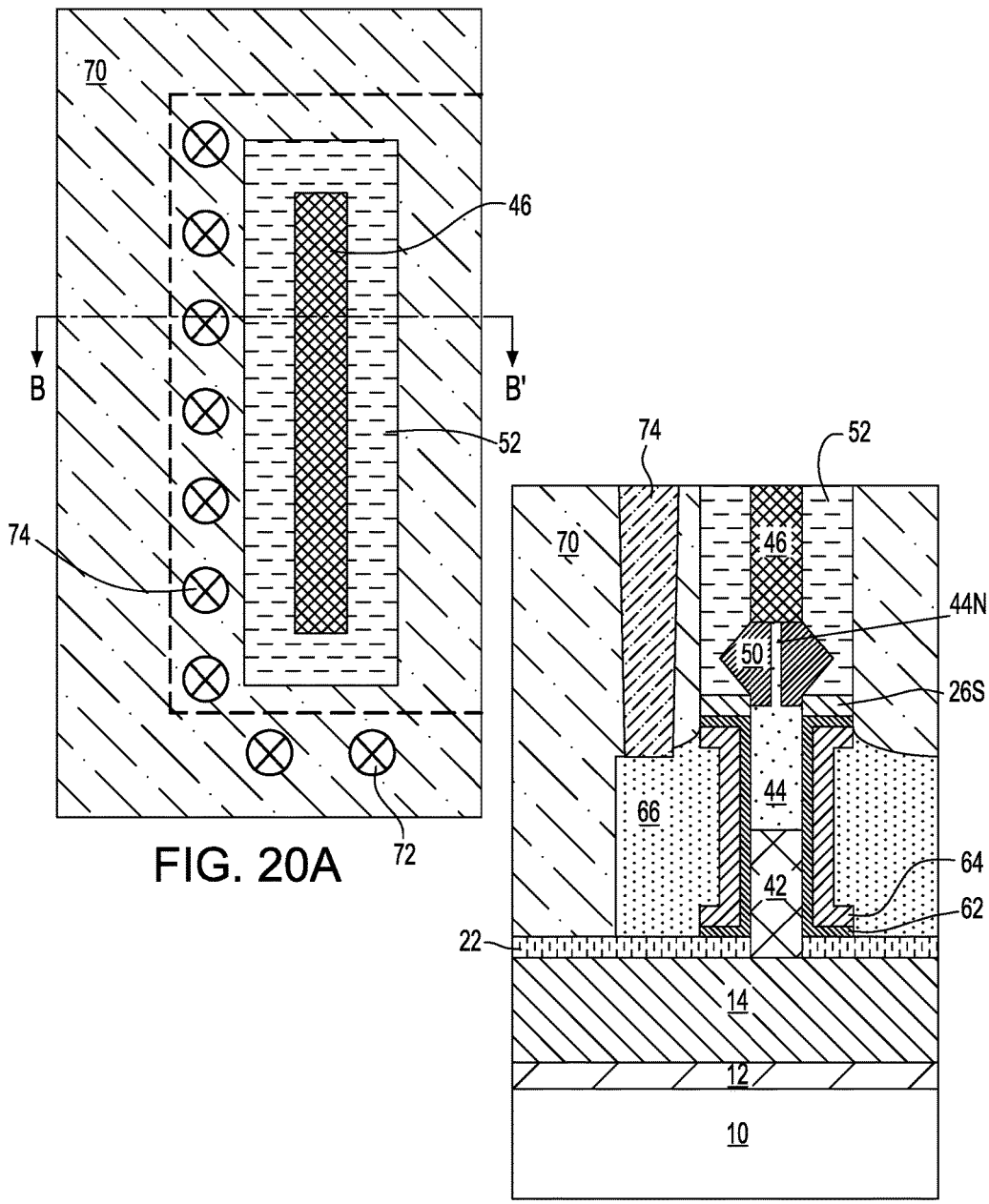
FIG. 20A is a top view of the exemplary semiconductor structure of FIGS. 19A and 19B after forming gate contact structures contacting the gate electrode.
FIG. 20B is a cross-sectional view of the exemplary semiconductor structure of FIG. 20A along line B-B'.

Referring now to FIGS. 20A and 20B, there are illustrated various views of the exemplary semiconductor structures of FIGS. 19A and 19B after forming one or more gate contact structures 74. The gate contact structures 74 extend through the ILD layer 70 to form contact with the gate electrode 66. The gate contact structures 74 can be formed by performing processing steps described above in FIGS. 19A and 19B for the formation of first anode/cathode contact structures 72.

Figures 21A, 21B:
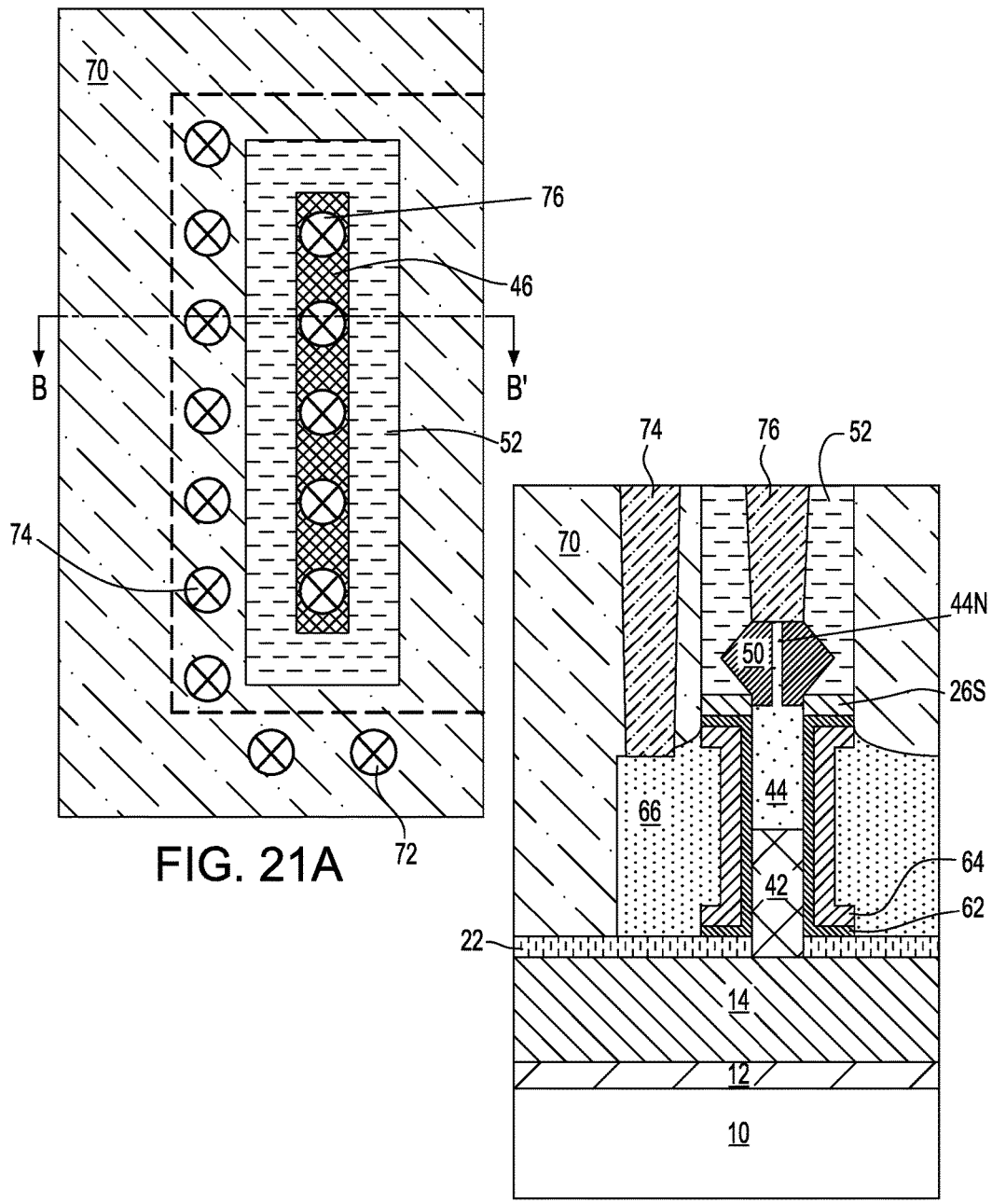
FIG. 21A is a top view of the exemplary semiconductor structure of FIGS. 20A and 20B after forming second anode/cathode contact structures contacting the doped top semiconductor region.
FIG. 21B is a cross-sectional view of the exemplary semiconductor structure of FIG. 21A along line B-B'.

Referring now to FIGS. 21A and 21B, there are illustrated various views of the exemplary semiconductor structures of FIGS. 20A and 18B after forming more or more second anode/cathode contact structures 76. The second anode/cathode contact structures 76 extend through the dielectric cap 46 to form contact with the doped top semiconductor region 50. The second anode/cathode contact structures 76 can be formed by performing processing steps described above in FIGS. 19A and 19B for the formation of first anode/cathode contact structures 72.

While the methods and structures disclosed herein have been particularly shown and described with respect to preferred embodiments thereof, it will be understood by those skilled in the art that the foregoing and other changes in forms and details may be made without departing from the spirit and scope of the present application. It is therefore intended that the methods and structures disclosed herein not be limited to the exact forms and details described and illustrated, but fall within the scope of the appended claims.

What is claimed is:

1. A method of forming a semiconductor structure comprising:
    forming a first doped semiconductor segment of a first conductivity type in a lower portion of a trench that extends through a material stack located on a doped bottom semiconductor layer of the first conductivity type, wherein the material stack comprises, from bottom to top, a bottom spacer layer, a sacrificial gate layer, and a dielectric capping layer;
    forming a second doped semiconductor segment of a second conductivity type on the first doped semiconductor segment within the trench, wherein the second conductivity type is opposite from the first conductivity type,
    removing the dielectric capping layer to exposing a top portion of the second doped semiconductor segment;
    forming a doped top semiconductor region of the second conductivity type laterally surrounding the top portion of the second doped semiconductor segment;
    forming a sidewall spacer on sidewalls of the doped top semiconductor region;
    removing the sacrificial gate layer;
    forming a gate structure laterally surrounding an upper portion of the first doped semiconductor segment and a lower portion of the second doped semiconductor segment previously covered by the sacrificial gate layer; and
    narrowing the top portion of the second doped semiconductor segment to provide a narrow top portion prior to the forming the doped top semiconductor region, wherein the doped top semiconductor region is formed on sidewalls of the narrowed top portion of the second doped semiconductor segment.

2. The method of claim 1, wherein the doped bottom semiconductor layer is located on a substrate.

3. The method of claim 2, wherein the substrate comprises a semiconductor substrate and a punch through stop (PTS) layer of the second conductivity type located on the semiconductor substrate.

4. The method of claim 1, further comprising forming a protective layer on sidewalls of the sacrificial gate layer that are exposed by the trench prior to the forming the first doped semiconductor segment, and removing the protective layer before forming the gate structure.

5. The method of claim 1, wherein the forming the first doped semiconductor segment is performed by epitaxially growing a semiconductor material from a surface of the doped bottom semiconductor layer that is exposed by the trench.

6. The method of claim 1, further comprising forming a dielectric cap on the second doped semiconductor segment within the trench prior to the removing the dielectric capping layer, wherein the dielectric cap has a top surface coplanar with a top surface of the dielectric capping layer, and the sidewall spacer is present on sidewalls of the dielectric cap.

7. The method of claim 1, wherein the material stack further comprises a top spacer layer located between the sacrificial gate layer and the dielectric capping layer, wherein the trench extends through the top spacer layer.

8. The method of claim 7, further comprising removing portions of the top spacer layer that are not covered by the sidewall spacer prior to the removing the sacrificial gate layer to provide a top spacer, wherein the top spacer separates the doped top semiconductor region from the gate structure.

\* \* \* \* \*